United States Patent [19]
Nii

[11] Patent Number: 5,793,681
[45] Date of Patent: Aug. 11, 1998

[54] MULTIPORT MEMORY CELL CIRCUIT HAVING READ BUFFER FOR REDUCING READ ACCESS TIME

[75] Inventor: Koji Nii, Itami, Japan

[73] Assignee: Mitsubishi Denki Kabushiki Kaisha, Tokyo, Japan

[21] Appl. No.: 870,358

[22] Filed: Jun. 6, 1997

Related U.S. Application Data

[62] Division of Ser. No. 626,854, Apr. 2, 1996, Pat. No. 5,684,743, which is a division of Ser. No. 383,860, Feb. 6, 1995, Pat. No. 5,535,159, which is a division of Ser. No. 105,629, Aug. 13, 1993, Pat. No. 5,420,813.

[30] Foreign Application Priority Data

Sep. 17, 1992 [JP] Japan ................... 4-247723

[51] Int. Cl.$^6$ ............................... G11C 7/00
[52] U.S. Cl. ................. 365/189.05; 365/189.04; 365/189.08; 365/190; 365/230.05
[58] Field of Search ............... 365/189.05, 189.04, 365/189.08, 230.05, 190

[56] References Cited

U.S. PATENT DOCUMENTS 5,477,489 12/1995 Wiedmann ............ 365/189.04
5,477,502 12/1995 Hayashi ............... 365/230.05

Primary Examiner—David C. Nelms
Assistant Examiner—Andrew Q. Tran
Attorney, Agent, or Firm—Oblon, Spivak, McClelland, Maier & Neustadt, P.C.

[57] ABSTRACT

In order to improve ability for driving the potential of a read bit line (192) to a high level, an output terminal (201b) of a memory circuit (21) and a read word line (182) are connected input terminals (204, 205) of a NAND gate (15) respectively. A gate of a transistor (123) is connected to an output terminal (203) of the NAND gate (15) and its source is connected to a power supply line (111) to be supplied with a VDD potential, while its drain is connected to the read bit line (192). MOS transistors (133, 134) are connected in series between the bit line (192) and a grounding conductor (112). Gates of the transistors (133, 134) are connected to the output terminal (203) and the input terminal (205) of the NAND gate (15) respectively. Thus, a time for converting the output terminal from a low level to a high level is reduced, whereby an access time can be reduced.

2 Claims, 32 Drawing Sheets

MULTIPORT MEMORY CELL CIRCUIT HAVING READ BUFFER FOR REDUCING READ ACCESS TIME

This is a Division of application Ser. No. 08/626,854, filed on Apr. 2, 1996, now U.S. Pat No. 5,684,743, which is a Division of application Ser. No. 08/383,860, filed on Feb. 6, 1995, U.S. Pat. No. 5,535,159, which is a Division of application Ser. No. 08/105,629, filed Aug. 13, 1993, U.S. Pat. No. 5,420,813.

BACKGROUND OF THE INVENTION

1. Field of the Invention

The present invention relates to a memory cell circuit, and more particularly, it relates to a multiport memory which has independently accessible write and read ports.

2. Description of the Prior Art

A. Prior Art (A-1) First Prior Art

FIG. 32 is a circuit diagram showing an exemplary structure of a memory cell circuit 17a of a conventional multiport memory having a single write port and a single read port. A memory circuit 21 is formed by a flip-flop circuit having inverter circuits 14a and 14b whose output terminals 201a and 201b are connected to input terminals of the inverter circuits 14b and 14a respectively. Thus, data stored in the memory circuit 21 complementarily appear at the output terminals 201a and 201b of the inverter circuits 14a and 14b.

FIGS. 33 and 34 are diagrams illustrating the structure and the operation of an inverter circuit 14 shown in FIG. 32 as inverters 14a–c. FIG. 33 is a logic symbol diagram of the inverter circuit 14, and FIG. 34 illustrates the inverter circuit 14 which is formed by MOS transistors.

Referring to FIG. 34, gates and drains of a P-channel MOS transistor 51 and an N-channel MOS transistor 52 are connected in common respectively. A power supply line 111 is connected to a source of the transistor 51, to supply a VDD potential. On the other hand, a grounding conductor 112 is connected to a source of the transistor 52, to supply a GND potential. An input terminal 202 of the inverter circuit 14 having such a structure is connected with the gates of the transistors 51 and 52 in common, while its output terminal 201 is connected with the drains of the transistors 51 and 52 in common.

When low-level data, i.e., the GND potential is supplied to the input terminal 202 of the inverter circuit 14, the transistor 51 enters a conducting state and the transistor 52 enters a cutoff state, so that the output terminal 201 is driven at the VDD potential. When high-level data, i.e., the VDD potential is supplied to the input terminal 202, on the other hand, the transistor 51 enters a cutoff state and the transistor 52 enters a conducting state, so that the output terminal 201 is driven at the GND potential. Namely, the output terminal 201 outputs low-level data which is reverse to the received high-level data.

Referring again to FIG. 32, an input of the inverter circuit 14b goes low and its output goes high if an output of the inverter circuit 14a is at a low level, for example. Namely, the terminals 201a and 201b of the memory circuit 21 go low and high respectively. Thus, it is possible to hold data in the terminals 201a and 201b of the memory circuit 21, which is formed by a flip-flop circuit.

The aforementioned memory circuit 21 is provided with write access gates for writing data supplied in the write port, to be connected with write bit lines 191a and 191b for transferring write data and a write word line 181 for selecting a desired memory cell circuit.

The write access gates are formed by N-channel MOS transistors 13a and 13b. The transistor 13a has a drain which is connected to the terminal 201a of the memory circuit 21, a source which is connected to the write bit line 191a, and a gate which is connected to the write word line 181. Similarly, the transistor 13b has a drain which is connected to the other terminal 201b of the memory circuit 21, a source which is connected to the write bit line 191b, and a gate which is connected to the write word line 181.

Further, a read buffer circuit 22a is provided for reading the data stored in the memory circuit 21, and connected with a read bit line 192 for transferring data to be read and a read word line 184 for selecting a desired memory cell circuit.

The read buffer circuit 22a is formed by an inverter circuit 14c having an input terminal 202c and an output terminal 201c, and an N-channel MOS transistor 50 which is a read access gate. The transistor 50 has a drain which is connected to the output terminal 201c of the inverter circuit 14c, a source which is connected to the read bit line 192, and a gate which is connected to the read word line 184. The input terminal 202c of the inverter circuit 14c is connected to the terminal 201b of the memory circuit 21 to connect the read buffer circuit 22a with the memory circuit 21, thereby forming the memory cell circuit 17a.

The operation of the aforementioned memory cell circuit 17a is now described. In order to write data, a write driver circuit (not shown) which is connected to the bit lines 191a and 191b is so employed as to drive the bit lines 191a and 191b to low and high levels in response to the value of the data to be written. At this time, the bit lines 191a and 191b are supplied with logical levels which are complementary to each other. In other words, the bit line 191b is driven to a high level when the bit line 191a is driven to a low level, and vice versa.

Thereafter the word line 181 is converted to a high level, thereby bringing the access gates 13a and 13b into conducting states. Thus, the terminals 201a and 201b of the memory circuit 21 holding the data are electrically connected with the bit lines 191a and 191b respectively.

Thus, logical levels at the terminals 201a and 201b of the memory circuit 21 are equalized to those supplied to the bit lines 191a and 191b respectively regardless of the logical level of the held data. The write operation is thus completed.

When the word line 181 is converted to a low level after the completion of the write operation, the access gates 13a and 13b are so cut off that the memory circuit 21 holds the written data. Even if the values of the bit lines 191a and 191b are thereafter changed, the logical level of the held data remains unchanged since the bit lines 191a and 191b are not electrically connected with the memory circuit 21.

Description is now made on a data read operation. The word line 184 is so converted to a high level that the access gate 50 enters a conducting state. Thus, the output terminal 201c of the inverter circuit 14c forming the read buffer circuit 22a is electrically connected with the bit line 192, so that the logical level which is supplied to the bit line 192 is driven to a logical level which is supplied to the terminal 201c, i.e., a logical level complementary to that of the data stored in the terminal 201b of the memory circuit 21.

The bit line 192 is connected with a sense amplifier circuit (not shown) directly or through a transfer gate, so that the data read on the bit line 192 is driven to a circuit of a next stage. The read operation is completed in the aforementioned manner.

When the word line 184 is converted to a low level after the completion of the read operation, the access gate 50 enters a cutoff state so that the bit line 192 is electrically cut off from the read buffer circuit 22a.

Thus, the read buffer circuit 22a is so provided in the memory cell circuit 17a as to prevent the memory data from destruction by the read operation. Further, it is possible to simultaneously perform read and write operations since the data are read and written from independent ports.

(A-2) Second Prior Art

FIG. 35 is a circuit diagram showing another conventional memory cell circuit 17b having a read buffer circuit 22b, which is provided with a CMOS transistor pair in place of the access gate 50 provided in the read buffer circuit 22a shown in FIG. 32.

The circuit structure of this memory cell circuit 17b is now described. A memory circuit 21 is formed in a similar manner to that shown in FIG. 32. The read buffer circuit 22b is formed by an inverter circuit 14c, and read access gates which are defined by a P-channel MOS transistor 54 and an N-channel MOS transistor 53.

The transistors 53 and 54 have drains which are connected to an output terminal 201c of the inverter circuit 14c in common, and sources which are connected to a read bit line 192 in common. The transistors 53 and 54 further have gates which are connected to read word lines 184 and 185 respectively.

An input terminal 202c of the inverter circuit 14c is connected to a terminal 201b of the memory circuit 21 to connect the memory circuit 21 with the read buffer circuit 22b, thereby forming the memory cell circuit 17b.

A data write operation of the aforementioned memory cell circuit 17b is identical to that of the first prior art. As to a data read operation, on the other hand, the read word lines 184 and 185 are in a complementary relation to each other for transferring non-inversion and inversion signals respectively. The word lines 184 and 185 are converted to high and low levels respectively, so that the access gates 53 and 54 enter conducting states.

Thus, the output terminal 201c of the inverter circuit 14c forming the read buffer circuit 22b is electrically connected to the bit line 192, so that a logical level which is supplied to the bit line 192 is driven to a logical level which is supplied to the terminal 201c, i.e., that complementary to the logical level of data stored in the terminal 201b of the memory circuit 21.

The bit line 192 is connected with a sense amplifier circuit (not shown) directly or through a transfer gate, so that data read on the bit line 192 is driven to a circuit of a next stage. The read operation is completed in the aforementioned manner.

After the completion of the read operation, the word lines 184 and 185 are converted to low and high levels respectively, whereby the access gates 53 and 54 enter cutoff states and the bit line 192 is electrically cut off from the read buffer circuit 22b.

(A-3) Third Prior Art

FIG. 36 is a circuit diagram showing a modification of the memory cell circuit 17b according to the second prior art. The circuit structure of this memory cell circuit 17c is now described. A memory circuit 21 has the same structure as that of the first prior art. A read buffer circuit 22c is formed by P-channel transistors 55 and 56 and N-channel MOS transistors 57 and 58.

A source of the transistor 56 and a drain of the transistor 55 are connected in common while a source of the transistor 55 is connected to a power supply line 111 to be supplied with a VDD potential. A source of the transistor 57 and a drain of the transistor 58 are connected in common, while the source of the transistor 57 is connected to a grounding conductor 112 to be supplied with a GND potential. Gates of the transistors 55 and 58 are connected in common to form the read buffer circuit 22c.

Gates of the transistors 57 and 56 are connected to word lines 184 and 185 respectively. The gates of the transistors 55 and 58 are connected to the terminal 201b of the memory circuit 21 in common to connect the memory circuit 21 with the read buffer circuit 22c, thereby forming the memory cell circuit 17c.

A data write operation of the memory cell circuit 17c is identical to that of the first prior art. As to a data read operation, on the other hand, the read word lines 184 and 185 are in a complementary relation to each other for transferring non-inversion and inversion signals respectively similarly to the second prior art. The word lines 184 and 185 are converted to high and low levels respectively, so that the transistors 56 and 57 enter conducting states.

If a logical level which is supplied to the terminal 201b of the memory circuit 21 is at a low level, the transistors 55 and 58 enter conducting and cutoff states respectively. Namely, a bit line 192 is driven to the VDD potential, so that high-level data is read.

When the transistors 56 and 57 are in conducting states and the terminal 201b of the memory circuit 21 is at a high level, on the other hand, the transistors 55 and 58 enter cutoff and conducting states respectively. Namely, the bit line 192 is driven to the GND potential, so that low-level data is read.

The bit line 192 is connected with a sense amplifier circuit (not shown) directly or through a transfer gate, so that the data read on the bit line 192 is driven to a circuit of a next stage. The read operation is completed in the aforementioned manner.

After the completion of the read operation, the word lines 184 and 185 are converted to low and high levels, so that the transistors 56 and 57 enter cutoff states and the bit line 192 is electrically cut off from the read buffer circuit 22c.

The memory cell circuit 17a according to the first prior art is adapted to read both high and low level data with a single read bit line 184. However, it is impossible to completely transfer high-level data since the read access gate is formed only by the N-channel MOS transistor 50.

When high-level data is read, the potential of the read bit line 192 can be driven through the N-channel MOS transistor 50 merely to a level which is reduced from the VDD potential by the threshold value of the MOS transistor 50 even if the output of the inverter circuit 14c of the read buffer circuit 22a is at the VDD potential (high level).

Due to such incomplete transfer of the VDD potential, a sufficient operation margin cannot be ensured as a source voltage supplying the VDD potential is reduced, leading to a malfunction as the case may be. Namely, the first prior art has such a first problem that a logical level which is reverse to that of the data stored in the memory circuit 21 may be disadvantageously driven to the circuit of the next stage even if high-level data is read, since the potential supplied to the bit line 192 cannot be completely raised up to the VDD potential.

When high-level data is read on the read bit line 192, further, the read bit line 192 is driven by the P-channel MOS transistor 51 forming the inverter circuit 14c, while a delay at the P-channel MOS transistor 50 serving as an access gate is inevitably added to the access time since the bit line 192 is driven through the transistor 50. Namely, the first prior art has such a second problem that the transistor 50 hinders reduction of the access time.

The second prior art is so structured as to solve the first problem. Namely, access gates are defined by transfer gates formed by a CMOS transistor pair employing both P-channel and N-channel MOS transistors 54 and 53.

When high-level data is read on the read bit line 192, therefore, the read bit line 192 is completely driven to the VDD potential to cause no problem as to the operation margin. However, the bit line 192 is driven through the access gates similarly to the first prior art, to result in the second problem of the unnecessary increase of the access time caused by delays in the access gates.

The operation margin is improved also in the third prior art. In this case, however, the two transistors are connected in series between the VDD or GND potential and the bit line 192, to lead to a long delay time.

When high-level data is read on the read bit line 192, the read bit line 192 is driven to the VDD potential through the P-channel MOS transistors 55 and 56. The above problem is particularly remarkable in this case since the operating speed of a P-channel MOS transistor is generally slower than that of an N-channel MOS transistor.

Thus, each of the conventional memory cell circuits has the following problems in relation to a read operation:

(1) A stable read operation cannot be performed since it is impossible to ensure a sufficient operation margin.

(2) A delay time in a read buffer circuit for driving a bit line is so large that an access time is retarded.

SUMMARY OF THE INVENTION

In a first aspect of the present invention, a memory cell circuit comprises memory means which stores memory logic taking either one of complementary first and second logical values and has a normal output end for outputting the memory logic, and at least one read means each including an output terminal, a first potential point having a potential corresponding to the first logical value, a second potential point having a potential corresponding to the second logical value, a control terminal for providing a control signal for controlling whether the output terminal is supplied with output logic which is identical to the memory logic or brought into a floating state, a first MOS transistor having first and second current electrodes which are connected to the first potential point and the output terminal respectively, and a control electrode, a second MOS transistor, having a first current electrode, a second current electrode which is connected to the output terminal, and a control electrode which is supplied with the control signal, and being driven by the control signal, a third MOS transistor having a control electrode which is supplied with inverted memory logic which is complementary to the memory logic, and first and second current electrodes which are connected in series to the second MOS transistor between the second potential point and the output terminal, and a logic circuit which is driven by the control signal for supplying a drive signal for driving the first MOS transistor to the control electrode of the first MOS transistor on the basis of the memory logic.

Preferably, the memory circuit further comprises write means for externally writing the memory logic in the memory means.

Preferably, the write means comprises a fourth MOS transistor having a first current electrode which is connected to the normal output end, a second current electrode which is supplied with prescribed logic to be written as the memory logic, and a control electrode which is supplied with a write signal for determining whether or not the writing is performed.

Preferably, the drive signal is a signal which is complementary to the memory logic.

Preferably, the first MOS transistor is of a first conductivity type, and the second and third MOS transistors are of a second conductivity type which is complementary to the first conductivity type.

Preferably, the first MOS transistor is driven when the second logical value is supplied to the control electrode thereof, and the second and third MOS transistors are driven when the first logical value is supplied to the control electrodes thereof.

Preferably, the potential corresponding to the first logical value is higher than the potential corresponding to the second logical value.

Preferably, the logic circuit comprises a logic element for inverting the logical product of the control signal and the memory logic, which correspond to each other, for obtaining the drive signal.

Preferably, the potential corresponding to the first logical value is lower than the potential corresponding to the second logical value.

Preferably, the logic circuit comprises a logic element for taking the logical sum of the control signal and the memory logic, which correspond to each other, and inverting the same for obtaining the drive signal.

Preferably, the drive signal is supplied to the control electrode of the third MOS transistor as the inverted memory logic.

Preferably, the memory cell circuit comprises a plurality of read means.

Preferably, the control signal which is supplied in each of the plurality of read means exclusively drives any one of the plurality of read means.

Preferably, the second current electrode of the second MOS transistor is connected to the output terminal, the second current electrode of the third MOS transistor is connected to the first current electrode of the second MOS transistor, and the first current electrode of the third MOS transistor is connected to the second potential point.

Preferably, the memory means further has a reverse output end for outputting a logical value which complementary to the memory logic, and the reverse output end is connected to the control electrode of the third MOS transistor.

Preferably, the memory cell circuit further comprises write means for externally writing the memory logic in the memory means.

Preferably, the write means comprises a fourth MOS transistor having a first current electrode which is connected to the normal output end, a second current electrode which is supplied with a prescribed logical value to be written as the memory logic, and a control electrode which is supplied with a write signal for determining whether or not the writing is performed.

Preferably, the write means further comprises a fifth MOS transistor having a first current electrode which is connected to the reverse output end, a second current electrode which is supplied with a prescribed logical value to be written as the memory logic, and a control electrode which is supplied with a write signal for determining whether or not the writing is performed.

Preferably, the memory means further includes a first inverter having an input end which is connected to the normal output end and an output end which is connected to the reverse output end, and a second inverter which is connected in antiparallel with the first inverter.

Preferably, the drive signal is a signal which is complementary to the memory logic.

Preferably, the first MOS transistor is of a first conductivity type, and the second and third MOS transistors are of a second conductivity type which is complementary to the first conductivity type.

Preferably, the first MOS transistor is driven when the second logical value is supplied to the control electrode thereof, and the second and third MOS transistors are driven when the first logical value is supplied to the control electrodes thereof.

Preferably, the potential corresponding to the first logical value is higher than the potential corresponding to the second logical value.

Preferably, the logic circuit comprises a logic element for inverting the logical product of the control signal and the memory logic, which correspond to each other, for obtaining the drive signal.

Preferably, the potential corresponding to the first logical value is lower than the potential corresponding to the second logical value.

Preferably, the logic circuit comprises a logic element for obtaining the logical sum of the control signal and the memory logic, which correspond to each other, and inverting the same for obtaining the drive signal.

Preferably, the second current electrode of the second MOS transistor is connected to the output terminal, the second current electrode of the third MOS transistor is connected to the first current electrode of the second MOS transistor, and the first current electrode of the third MOS transistor is connected to the second potential point.

Preferably, the memory cell circuit comprises a plurality of read means.

Preferably, the control signal which is supplied in each of the plurality of read means exclusively drives any one of the plurality of read means.

Preferably, the second current electrode of the third MOS transistor is connected to the output terminal, the second current electrode of the second MOS transistor is connected to the first current electrode of the third MOS transistor, and the first current electrode of the second MOS transistor is connected to the second potential point.

Preferably, the second MOS transistor is also employed in the logic circuit.

Preferably, the memory cell circuit comprises a plurality of read means.

Preferably, the control signal which is supplied in each of the plurality of read means exclusively drives any one of the plurality of read means.

Preferably, the logic circuit comprises a second conductivity type fourth MOS transistor having a first current electrode which is connected to the second current electrode of the second MOS transistor, a second current electrode which is connected to the control electrode of the first MOS transistor, and a control electrode which is supplied with the memory logic, a first conductivity type fifth MOS transistor having a first current electrode which is connected to the first potential point, a second current electrode which is connected to the first current electrode of the fourth MOS transistor, and a control electrode which is connected to the control electrode of the second MOS transistor, and a first conductivity type sixth MOS transistor having a first current electrode which is connected to the first potential point, a second current electrode which is connected to the first current electrode of the fourth MOS transistor, and a control electrode which is connected to the control electrode of the fourth MOS transistor.

In a second aspect of the present invention, a memory cell circuit comprises a set of memory means each storing memory logic taking either one of first and second logical values which are complementary to each other, and having a normal output end for outputting the memory logic, and at least one read means each including an output terminal, a first potential point having a potential corresponding to the first logical value, a second potential point having a potential corresponding to the second logical value, a set of control terminals corresponding to the memory means for supplying a set of control signals for controlling whether the output terminal is supplied with output logic which is identical to the memory logic or brought into a floating state, at least one first MOS transistor each having first and second current electrodes which are connected to the first potential point and the output terminal respectively, and a control electrode, a set of second MOS transistors corresponding to the memory means, each having a first current electrode, a second current electrode which is connected to the output terminal, and a control electrode which is supplied with the control signal, and being driven by the control signals corresponding to the memory means respectively, a logic circuit for selecting the memory logic from a plurality of the memory logics by the set of control signals and supplying a drive signal for driving the first MOS transistor to the control electrode of the first MOS transistor on the basis thereof and, at least one third MOS transistor which is connected in series between the first current electrodes of the set of second MOS transistors and the second potential point, each having a control electrode which is supplied with inverted memory logic which is complementary to the one memory logic and first and second current electrodes.

Preferably, the memory circuit further comprises a set of write means corresponding to the memory means for externally writing the memory logics in the memory means.

Preferably, each write means comprises a fourth MOS transistor having a first current electrode which is connected to the normal output end, a second current electrode which is supplied with a prescribed logical value to be written as the memory logic, and a control electrode which is supplied with a write signal for determining whether or not the writing is performed.

Preferably, only one control signal corresponding to the one store means storing the one memory logic is activated in the set of control signals.

Preferably, the first MOS transistor is of a first conductivity type, and the second and third MOS transistors are of a second conductivity type which is complementary to the first conductivity type.

Preferably, the first MOS transistor is driven when the second logical value is supplied to the control electrode thereof, and the second and third MOS transistors are driven when the first logical value is supplied to the control electrodes thereof.

Preferably, the drive signal is a signal which is complementary to the one memory logic.

Preferably, a potential corresponding to the first logical value is higher than a potential corresponding to the second logical value.

Preferably, the logic circuit comprises a set of first logic elements corresponding to the memory means for taking the logical products of the control signals and the memory logics corresponding to each other, and a second logic element for taking the logical sum of outputs of the set of first logic elements and inverting the same for obtaining the drive signal.

Preferably, the potential corresponding to the first logical value is lower than the potential corresponding to the second logical value.

Preferably, the logic circuit comprises a set of first logic elements corresponding to the memory means for taking the logical sums of the control signals and the memory logics corresponding to each other, and a second logic element for taking the logical product of outputs of the set of first logic elements and inverting the same for obtaining the drive signal.

Preferably, the drive signal is supplied to the control electrode of the third MOS transistor as the inverted memory logic.

Preferably, the memory cell circuit comprises a plurality of the read means.

Preferably, the set of control signals which are supplied in each of the plurality of read means exclusively drive any one of the plurality of read means.

Preferably, the first MOS transistor is provided in correspondence to the set of second MOS transistors.

Preferably, the third MOS transistor is provided in correspondence to the set of second MOS transistors.

Preferably, the second current electrodes of the set of second MOS transistors are connected to the output terminal in common, the first current electrodes of the set of second MOS transistors are connected to the second current electrodes of corresponding third MOS transistor respectively, and the first current electrodes of the third MOS transistor is connected to the second potential point.

Preferably, the memory cell circuit comprises a single first MOS transistor.

Preferably, the memory cell circuit comprises a single third MOS transistor.

Preferably, the second current electrodes of the set of second MOS transistors are connected to the output terminal in common, the first current electrodes of the set of second MOS transistors are connected to the second current electrode of the third MOS transistor in common, and the first current electrode of the third MOS transistor is connected to the second potential point.

In the memory cell circuit according the first or second aspect of to the present invention, the first MOS transistor connects the output terminal to the first potential point. The third MOS transistor is controlled by the inverted memory logic which is complementary to the memory logic, to connect the output terminal to the second potential point. The second MOS transistor is connected in series with the third MOS transistor, to be ON-OFF controlled by the control signal.

According to the first or second aspect of the present invention, the potential of the output terminal fully swings from the second logical value to the first logical value, whereby the logical value can be stably read from the output terminal with a wide operation margin even if potential difference corresponding to the first and second logical values is reduced. Further, the operating time for changing the logical value of the output terminal from the second logical value to the first logical value is reduced, whereby reduction of the time required for the operation can be expected. Further, the control signal requires no inverted signal, whereby the number of wires can be reduced in structure.

Particularly according to the second aspect of the present invention, it is possible to reduce capacitance being parasitic on the output terminal when the output terminal is driven to the potential corresponding to the first logical value by a single first MOS transistor, thereby reducing the access time. Thus, a charge/discharge current flowing in the output terminal is also reduced, to save the power.

In a third aspect of the present invention, a memory cell circuit comprises memory means for storing memory logic taking either one of first and second logical values which are complementary to each other and having a normal output end for outputting the memory logic, and read means including an output terminal, a first potential point having a potential corresponding to the first logical value, a second potential point having a potential corresponding to the second logical value, a control terminal for supplying a control signal taking the first logical value for supplying the output terminal with output logic which is identical to the memory logic while taking the second logical value for bringing the output terminal into a floating state, a first MOS transistor having first and second current electrodes which are connected to the first potential point and the output terminal respectively, and a control electrode, a second MOS transistor having first and second current electrodes which are connected to the second potential point and the output terminal respectively, and a control electrode, and a logic circuit for supplying first and second cutoff signals for bringing at least one of the first and second MOS transistors into a cutoff state to the control electrodes of the first and second MOS transistors respectively on the basis of the control signal and the memory logic.

Preferably, the memory cell circuit further comprises write means for externally writing the memory logic in the memory means.

Preferably, the write means comprises a third MOS transistor having a first current electrode which is connected to the normal output end, a second current electrode which is supplied with a prescribed logical value to be written as the memory logic, and a control electrode which is supplied with a write signal for determining whether or not the writing is performed.

Preferably, the first MOS transistor is of a first conductivity type, and the second MOS transistor is of a second conductivity type which is complementary to the first conductivity type.

Preferably, the first MOS transistor enters a cutoff state when the first logical value is supplied to the control electrode thereof, and the second MOS transistor enters a cutoff state when the second logical value is supplied to the control electrode thereof.

Preferably, the first and second cutoff signals are complementary to each other when the control signal performs control of supplying the output terminal with output logic which is the same logic as the memory logic, and both of the first and second cutoff signals are signals which are complementary to the memory logic when the control signal performs control of bringing the output terminal into a floating state.

Preferably, the logic circuit comprises a first logic element receiving the control signal and the memory logic and inverting the logical sum thereof for producing the first cutoff signal.

Preferably, the logic circuit further comprises a second logic element for receiving the control signal and the first cutoff signal and producing the cutoff signal by the logical sum thereof.

Preferably, the second logic element is an AND gate.

Preferably, the second logic element comprises a NOR gate having a first input end receiving the first control signal, an output end which is connected to the control electrode of the second MOS transistor, and a second output end, and an inverter for inverting the control signal and supplying the same to the second output end of the NOR gate.

Preferably, the memory means has a reverse output end for outputting a logical value which is complementary to the memory logic, and the logic circuit further comprises a second logic element having a first input end which is supplied with the control signal and a second input end which is connected to the reverse output end of the memory means for making the second cutoff signal by the logical sum of logical values which are supplied to the first and second input ends thereof.

Preferably, the write means further comprises a fourth MOS transistor having a first current electrode which is connected to the reverse output end, a second current electrode which is supplied with a prescribed logical value to be written as the memory logic, and a control electrode which is supplied with a write signal for determining whether or not the writing is performed.

In the memory cell circuit according to the third aspect of the present invention, the first and second MOS transistors connect the output terminals to the first and second potential points respectively. The first and second MOS transistors are turned on/off in accordance with the first and second cutoff signals respectively, so that at least either one is regularly in an OFF state.

According to the third aspect of the present invention, further, the potential of the output terminal fully swings from the first logical value to the second logical value and vice versa, whereby the logical value can be stably read from the output terminal with a wide operation margin even if potential difference corresponding to the first and second logical values is reduced. Further, both of the operating times for changing the logical value of the output terminal from the second logical value to the first logical value and vice versa are reduced, whereby reduction of the time required for the operation can be expected.

Accordingly, an object of the present invention is to provide a memory cell circuit of a multiport memory having a read buffer circuit which is improved in ability for driving a potential of a read bit line to a VDD potential, thereby attaining a high-speed access time.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

B. Description of Embodiments for Improving Single Conductivity Type Transistors In general, P-channel MOS transistors are slower in operation than N-channel MOS transistors, and hence improvement is preferably made as to the P-channel MOS transistors. The following first to tenth embodiments are described in relation to application of the present invention to P-channel MOS transistors.

As supplementarily explained in relation to some of the embodiments, the present invention is not exclusively applied to improvement as to P-channel MOS transistors.

(B-1) First Embodiment

Figure 1:
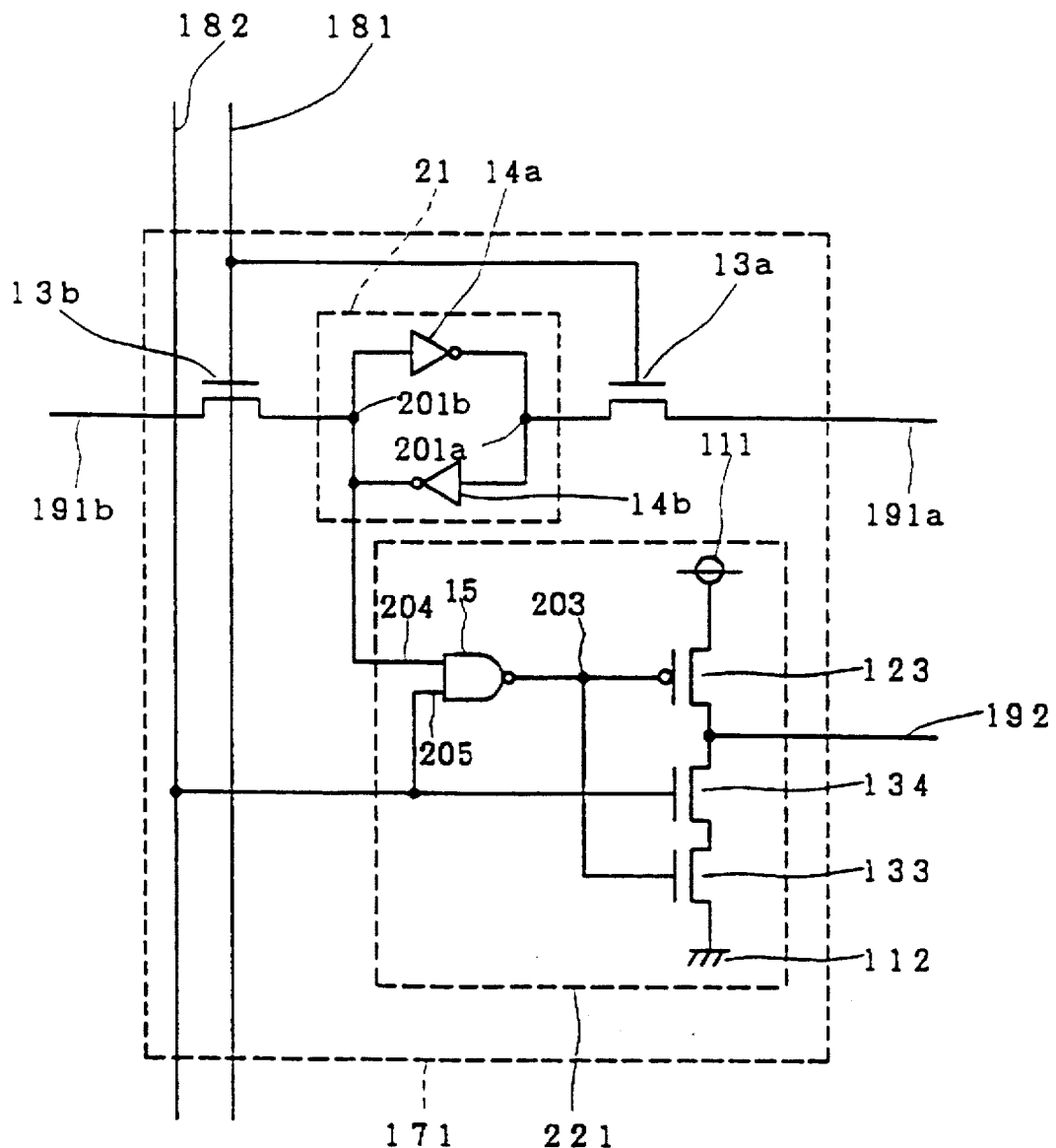
FIG. 1 is a circuit diagram showing the structure of a first embodiment according to the present invention.

FIG. 1 is a circuit diagram showing the structure of a memory cell circuit 171 of a multiport memory having a single write port and a single read port.

This memory cell circuit 171 comprises a memory circuit 21 and a read buffer circuit 221.

The memory circuit 21 is formed by a flip-flop circuit having inverter circuits 14a and 14b whose output terminals 201a and 201b are connected to input terminals of the counter inverter circuits 14b and 14a respectively, to store data. The memory circuit 21 is provided with write access gates for writing data, being received in the write port, in the memory cell circuit 171, and is connected with write bit lines 191a and 191b for transferring the write data and a write word line 181 for selecting a desired memory cell circuit.

The write access gates are formed by N-channel MOS transistors 13a and 13b. The transistor 13a has a drain which is connected to the terminal 201a of the memory circuit 21, and a source which is connected to the write bit line 191a. The transistor 13a further has a gate which is connected to the write word line 181.

Similarly, the transistor 13b has a drain which is connected to the terminal 201b of the memory circuit 21, and a source which is connected to the write bit line 191b. The transistor 13b further has a gate which is connected to the write word line 181.

Further, the read buffer circuit 221, which is adapted to read the data stored in the memory circuit 21, is connected with a read bit line 192 for transferring the data to be read and a read word line 182 for selecting a desired memory cell circuit.

The read buffer circuit 221 is formed by a NAND gate 15, a P-channel MOS transistor 123, and N-channel MOS transistors 133 and 134.

The transistor 123 has a source which is connected to a power supply line 111 to be supplied with a VDD potential, while the transistor 133 has a source which is connected to a grounding conductor 112 to be supplied with a GND potential. The transistor 134 has a source which is connected with a drain of the transistor 133. The transistors 123 and 134 have drains which are connected to the bit line 192 in common. The transistors 123 and 133 have gates which are connected to an output terminal 203 of the NAND gate 15, while the transistor 134 has a gate which is connected to the word line 182. The NAND gate 15 has an input terminal 204 which is connected with the terminal 201b of the memory circuit 21, and another input terminal 205 which is connected with the gate of the transistor 134.

Figure 2:
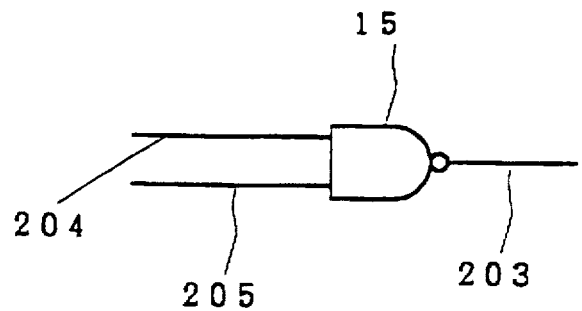
FIG. 2 is a logic symbol diagram of a NAND gate.
Figure 3:
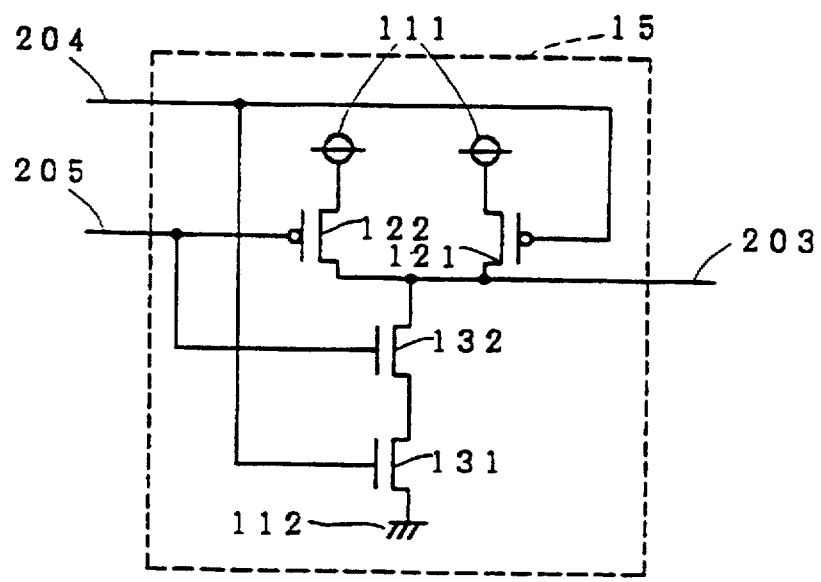
FIG. 3 is a circuit diagram showing an exemplary structure of a NAND gate.

FIGS. 2 and 3 illustrate the structure and the operation of the NAND gate 15 shown in FIG. 1. FIG. 2 is a logic symbol diagram of the NAND gate 15, and FIG. 3 illustrates an exemplary structure of the NAND gate 15 which is formed by MOS transistors.

Referring to FIG. 3, P-channel MOS transistors 121 and 122 have drains which are connected to the output terminal 203 in common. The transistors 121 and 122 further have sources which are connected to the power supply line 111, to be supplied with the VDD potential. An N-channel MOS transistor 132 has a source which is connected to a drain of an N-channel MOS transistor 131. The transistor 131 has a source which is connected with the grounding conductor 112 to be supplied with the GND potential, while the transistor 132 has a drain which is connected with the output terminal 203.

The transistors 121 and 131 have gates which are connected to the input terminal 204 in common, while the transistors 122 and 132 have gates which are connected to the input terminal 205 in common, to form the NAND gate 15.

The operation of the NAND gate 15 is now described. When the input terminal 204 of the NAND gate 15 is supplied with low-level data (GND potential), the transistor 121 enters a conducting state and the transistor 131 enters a cutoff state, whereby the output terminal 203 is driven to the VDD potential regardless of the value at the input terminal 205, to output high-level data.

When the input terminal 205 is supplied with low-level data (GND potential) similarly to the above, the transistor 122 enters a conducting state and the transistor 132 enters a cutoff state, whereby the output terminal 203 is driven to the VDD potential regardless of the value at the input terminal 204, to output high-level data.

When both of the input terminals 204 and 205 are supplied with high-level data, the transistors 121 and 122 enter cutoff states and the transistors 131 and 132 enter conducting states, whereby the output terminal 203 is driven to the GND potential, to output low-level data.

Namely, the NAND gate 15 so operates that its output goes high when at least either one of the two input terminals 204 and 205 is supplied with low-level data while outputting low-level data only when both of the terminals 204 and 205 are supplied with high-level data.

Referring again to FIG. 1, the operation of the memory cell circuit 171 is described. A data write operation of this circuit is absolutely identical to that of the first prior art. A write driver circuit (not shown) which is connected with the bit lines 191a and 191b is employed to drive the bit lines 191a and 191b to low or high levels in response to the value of the written data.

The bit lines 191a and 191b are driven to be complementary to each other. Namely, the bit line 191b is driven to a high level when the bit line 191a is driven to a low level, and vice versa.

Thereafter the word line 181 is converted to a high level, so that the access gates 13a and 13b enter conducting states. Thus, the terminal 201a of the memory circuit 21 holding data is electrically connected with the bit line 191a, while the terminal 201b of the memory circuit 21 is electrically connected with the bit line 191b. Therefore, logical levels which are supplied to the terminals 201a and 201b of the memory circuit 21 are equalized to those supplied to the bit lines 191a and 191b respectively, regardless of the logical levels of the data held therein. The data write operation is completed in the aforementioned manner.

After the completion of the data write operation, the word line 181 is converted to a low level to cut off the access gates 13a and 13b, so that the logical level of the written data is held in the memory circuit 21. Even if the logical levels supplied to the bit lines 191a and 191b are thereafter changed, the logical level of the held data remains unchanged since the bit lines 191a and 191b are electrically cut off from the memory circuit 21.

A data read operation is now described. The word line 182 is converted to a high level, so that the transistor 134 forming the read buffer circuit 221 enters a conducting state. Further, the logical level of the input terminal 205 which is connected to the word line 182 of the NAND gate 15 goes high, whereby the NAND gate 15 outputs a logical level, which is complementary to the value at the terminal 201b of the memory circuit 21, from its output terminal 203.

When the terminal 201b is at a high logical level, for example, the logical level at the output terminal 203 of the NAND gate 15 goes high. Thus, the transistor 123 enters a conducting state and the transistor 133 enters a cutoff state, whereby the bit line 192 is driven to the VDD potential, to read high-level data.

When the terminal 201b is at a low logical level, on the other hand, the logical level at the output terminal 203 of the NAND gate 15 goes high. The transistor 123 enters a cutoff state and the transistor 133 enters a conducting state while the transistor 134 is also in a conducting state, whereby the bit line 192 is driven to the GND potential. Namely, low-level data is read on the bit line 192.

The bit line 192 is connected with a sense amplifier circuit (not shown) directly or through a transfer gate, so that the read data is driven to a circuit of a next stage. The data read operation is completed in the aforementioned manner.

After the completion of the data read operation, the word line 182 is converted to a low level, so that the value at the output terminal 203 of the NAND gate 15 goes high and the transistor 123 enters a cutoff state. The transistor 134 also enters a cutoff state, whereby the bit line 192 is electrically disconnected from the read buffer circuit 221.

Thus, it is possible to simultaneously perform data read and write operations since the data are read and written from independent ports. The as-stored data are prevented from destruction caused by the read operation due to the read buffer circuit 171 provided in the memory cell circuit 221.

The bit line 192 fully swings between high and low levels in response to the logical level which is supplied to the terminal 201b of the memory circuit 21. Even if potential difference between the VDD potential and the GND potential which are supplied by the power supply line 111 and the grounding conductor 112 is reduced, therefore, it is possible to stably read the data from the bit line 192 with a wide operation margin.

According to this embodiment, it is possible to reduce the number of wires since no pair of complementary read word lines are required dissimilarly to the second or third prior art which enables a full swing of the bit line 192.

When the bit line 192 is driven to a high level at the final stage of the read buffer circuit 221, a high-speed operation is enabled since the bit line 192 is connected with the power supply line 111 by the single P-channel MOS transistor 123.

Figure 4:
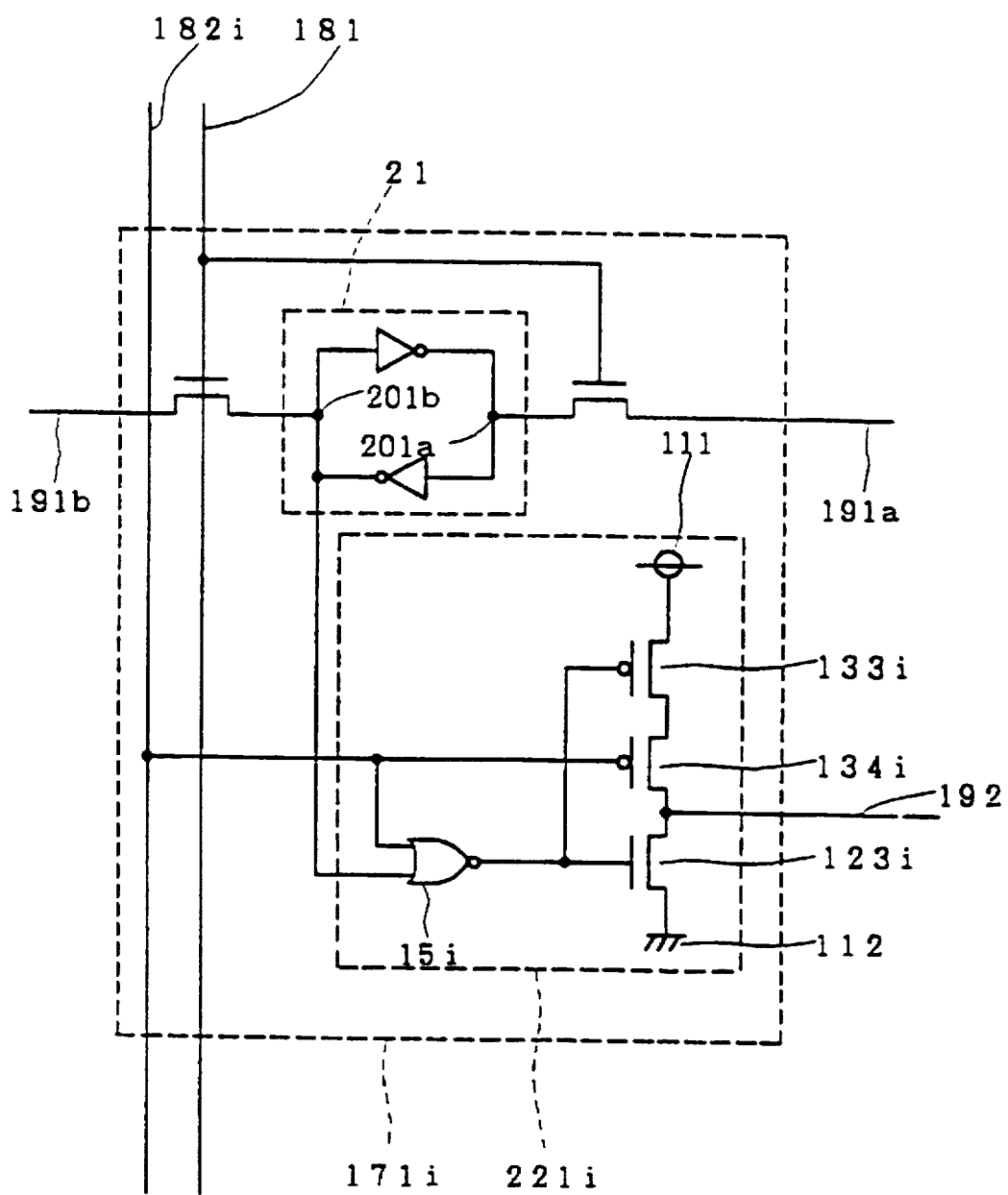
FIG. 4 is a circuit diagram showing the structure of a modification of the first embodiment according to the present invention.

FIG. 4 is a circuit diagram showing a modification of the first embodiment, in which an operating speed of an N-channel MOS transistor is improved. Referring to FIG. 4, a memory cell circuit 171i is provided with a read buffer circuit 221i in place of the read buffer circuit 221 shown in FIG. 1. This memory cell circuit 171i is connected with a read word line 182i which is supplied with a signal for driving the read buffer circuit 221i at a low level, in place of the read word line 182.

The read buffer circuit 221i is formed by a NOR gate 15i, an N-channel MOS transistor 123i, and P-channel MOS transistors 133i and 134i.

The transistor 123i has a source which is connected to a grounding conductor 112 to be supplied with a GND potential, while the transistor 133i has a source which is connected to a power supply line 111 to be supplied with a VDD potential. The transistor 134i has a source which is connected with a drain of the transistor 133i, while the transistors 123i and 134i have drains which are connected to a bit line 192 in common. The transistors 123i and 133i have gates which are connected to an output terminal of the NOR gate 15i in common, while the transistor 134i has a gate which is connected to a word line 182i. The NOR gate 15i has an input terminal which is connected with a terminal 201b of a memory circuit 21, and another input terminal which is connected with the gate of the transistor 134i.

As hereinabove described, the memory cell circuit 171i is formed by the memory circuit 21 and the read buffer circuit 221i. Such a structure is adapted to perform an operation which is complementary to that of the first embodiment. When the bit line 192 is driven to a low level, a high-speed operation is enabled since the bit line 192 is connected with the grounding conductor 112 by the single N-channel MOS transistor 123i.

Such a structure is effective when the P-channel MOS transistors have high drivability, or a sense amplifier circuit which is connected to the bit line 192 has a sufficiently low threshold value.

(B-2) Second Embodiment

Figure 5:
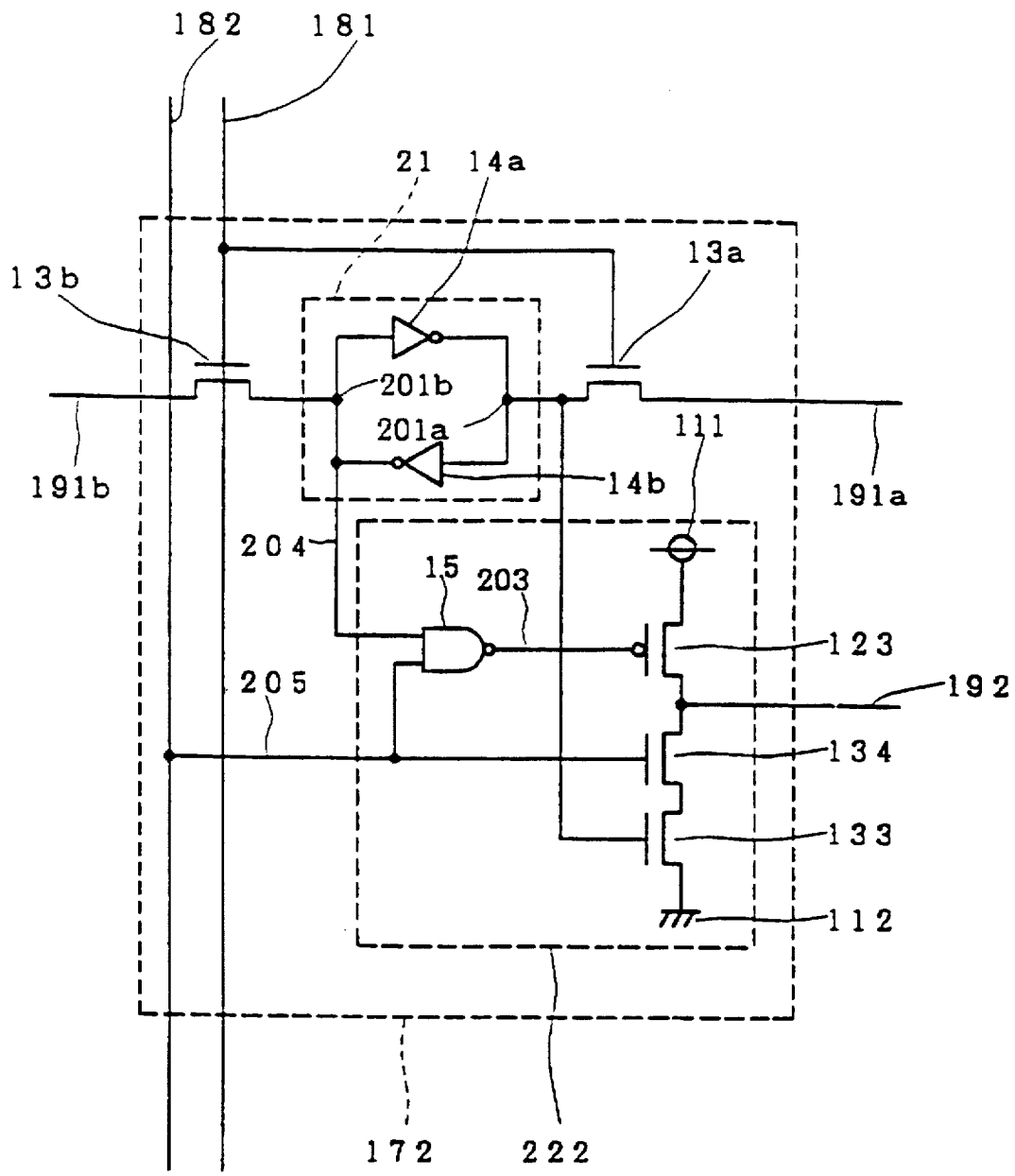
FIG. 5 is a circuit diagram showing the structure of a second embodiment according to the present invention.

FIG. 5 is a circuit diagram showing the structure of a memory cell circuit 172 of a multiport memory having a single write port and a single read port.

Referring to FIG. 5, the memory cell circuit 172 is identical in structure to the memory cell circuit 171 according to the first embodiment, except that a transistor 133 forming a read buffer circuit 222 has a gate which is connected not to an output terminal 203 of a NAND gate 15 but to a terminal 201a of a memory circuit 21.

The operation of the memory cell circuit 172 is now described. A data write operation is absolutely identical to that of the first embodiment.

In a data read operation, a word line 182 is converted to a high level, so that a transistor 134 forming the read buffer circuit 222 enters a conducting state. Further, the logical level of an input terminal 205 which is connected to a gate of the transistor 134 of the NAND gate 15 goes high, so that a logical level which is complementary to that supplied to a terminal 201b of the memory circuit 21 is outputted from the output terminal 203 of the NAND gate 15.

When the terminal 201b of the memory circuit 21 is supplied with a high logical level, for example, the logical level at the output terminal 203 of the NAND gate 15 goes low. On the other hand, the terminal 201a of the memory circuit 21 is supplied with a low logical level, whereby the transistor 123 enters a conducting state and the transistor 133 enters a cutoff state so that the bit line 192 is driven to a VDD potential. Namely, high-level data is read out.

When the terminal 201b is supplied with a low logical level, on the other hand, the logical level at the output terminal 203 of the NAND gate 15 goes high. On the other hand, the terminal 201a is supplied with a high logical level, whereby the transistor 123 enters a cutoff state and the transistor 133 enters a conducting state while the transistor 134 is also in a conducting state, so that the bit line 192 is driven to a GND potential. Namely, low-level data is read out.

The bit line 192 is connected with a sense amplifier circuit (not shown) directly or through a transfer gate, so that the read data is driven to a circuit of a next stage. The data read operation is completed in the aforementioned manner.

After the completion of the data read operation, the word line 182 is converted to a low level, so that the value at the output terminal 203 of the NAND gate 15 goes high and the transistor 123 enters a cutoff state. The transistor 134 also enters a cutoff state, so that the bit line 192 is electrically disconnected from the read buffer circuit 222.

The second embodiment having the aforementioned structure performs the same operation as the first embodiment, whereby an effect identical to that of the first embodiment can be attained.

Figure 6:
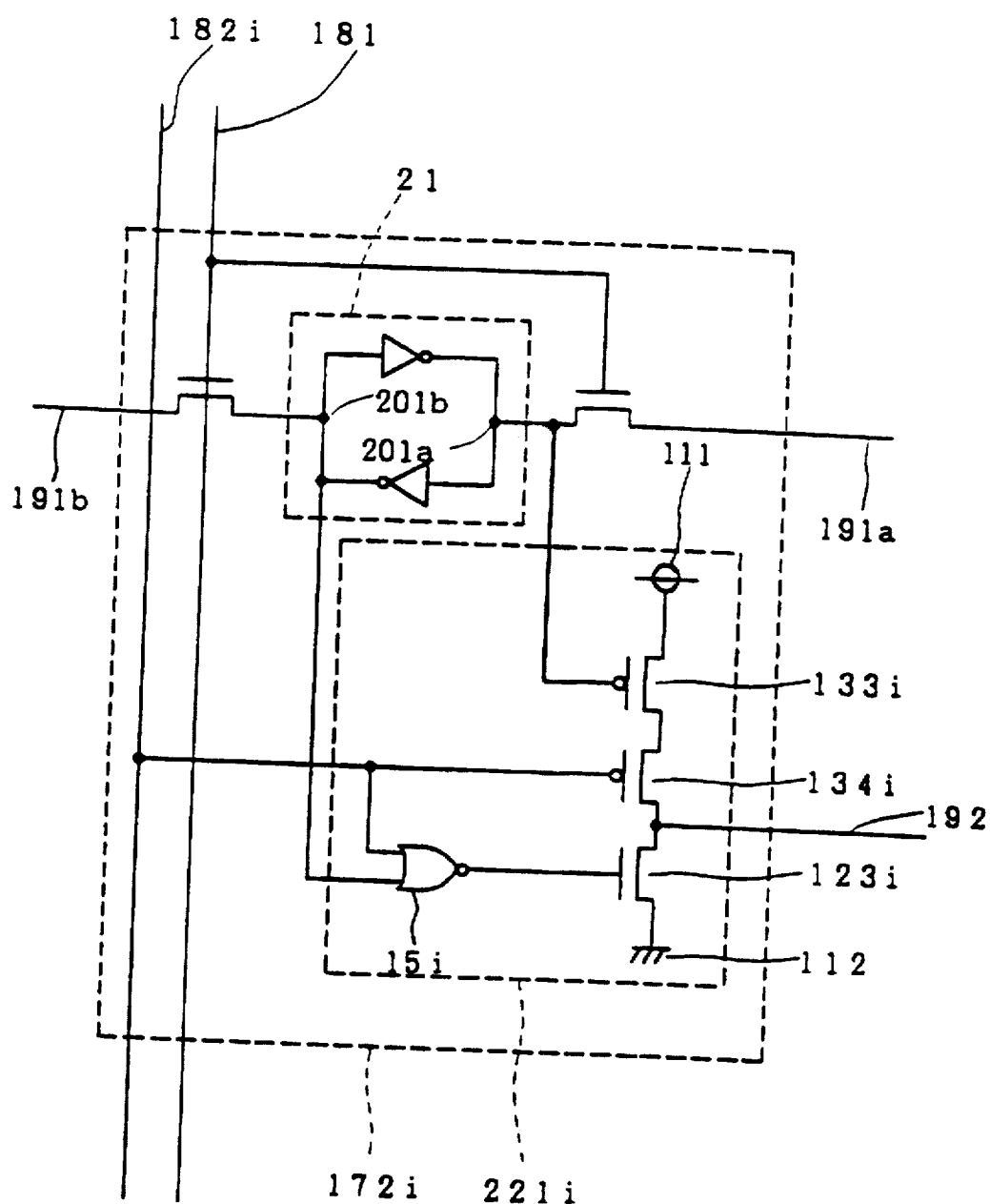
FIG. 6 is a circuit diagram showing the structure of a modification of the second embodiment according to the present invention.

FIG. 6 shows a modification of the second embodiment, in which an operation speed of an N-channel MOS transistor is improved. This modification of the second embodiment is identical in structure to the memory cell circuit 221i according to the modification of the first embodiment shown in FIG. 4, except that a transistor 133i forming a read buffer circuit 222i has a gate which is connected not to an output terminal of a NOR gate 15i but to a terminal 201a of a memory circuit 21.

When a bit line 192 is driven to a low level, therefore, a high-speed operation is enabled since the bit line 192 is connected with a grounding conductor 112 by a single N-channel MOS transistor 123i, similarly to the modification of the first embodiment shown in FIG. 4.

(B-3) Third Embodiment

Figure 7:
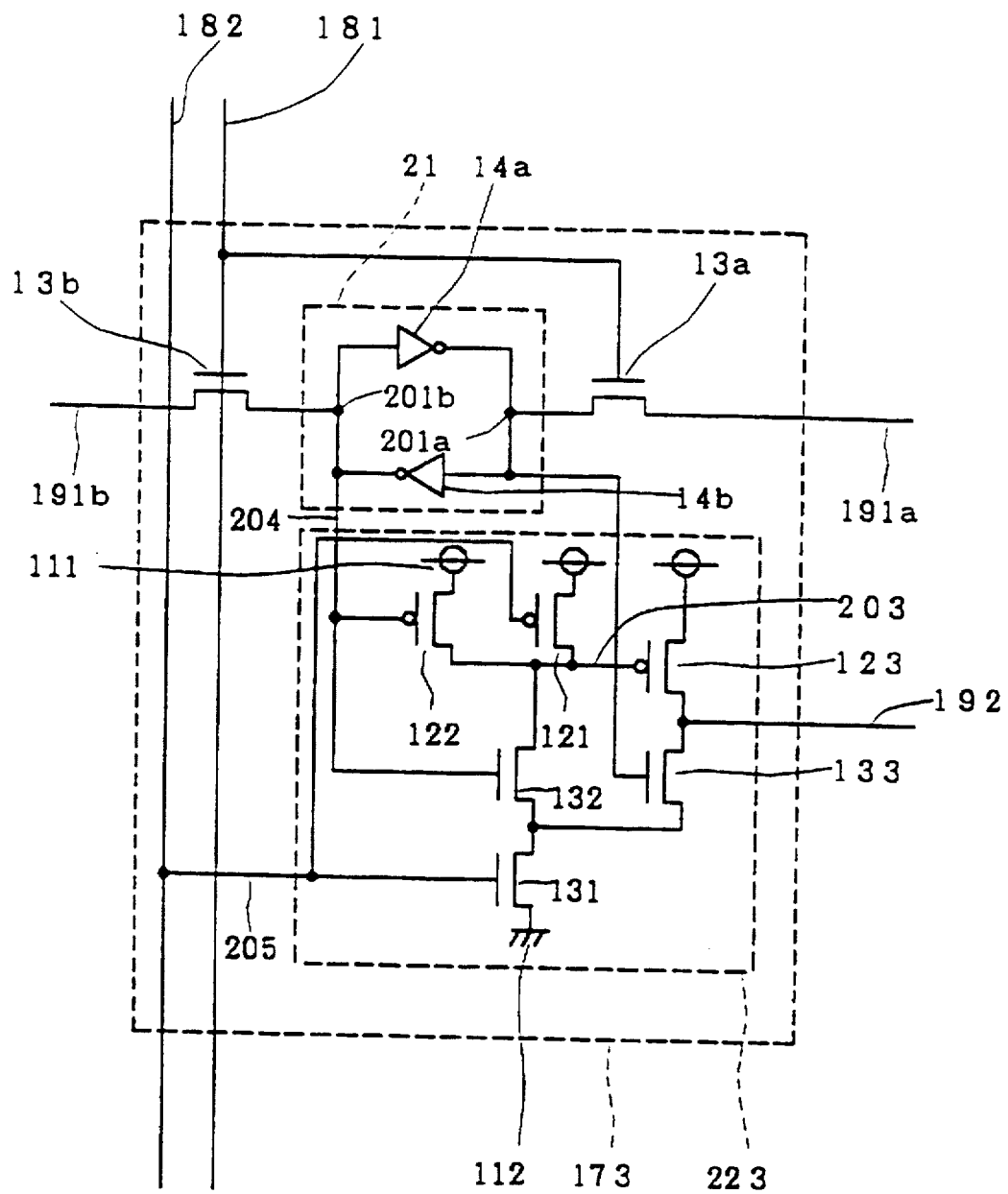
FIG. 7 is a circuit diagram showing the structure of a third embodiment according to the present invention.

FIG. 7 is a circuit diagram showing the structure of a memory cell circuit 173 of a multiport memory having a single write port and a single read port.

The circuit structure of this memory cell circuit 173 is now described. The memory cell circuit 173 comprises a memory circuit 21 and a read buffer circuit 223.

The memory circuit 21 is formed in a similar manner to that in the first embodiment. In the read buffer circuit 223, transistors 121, 122, 131 and 132 are connected in the manner shown in FIG. 3, to form a NAND gate.

In more concrete terms, gates of the transistors 122 and 132 are connected in common to form an input terminal 204 of the NAND gate, and this input terminal 204 is connected with a terminal 201a of the memory circuit 21. Further, gates of the transistors 121 and 131 are connected in common to form another input terminal 205 of the NAND gate, and this input terminal 205 is connected with a word line 182.

The transistor 123 has a source which is connected to a power supply line 111 to be supplied with a VDD potential, while the transistor 133 has a source which is connected to a drain of the transistor 131. The transistors 123 and 133 have drains which are connected to a bit line 192 in common. The transistor 123 has a gate which is connected to a terminal 203, which is an output terminal of the NAND gate, while the transistor 133 has a gate which is connected to the terminal 201a of the memory circuit 21.

In the read buffer circuit 223 having the aforementioned structure, the transistor 131 also serves as the transistor 134 in the second embodiment.

The operation of the memory cell circuit 173 is now described. A data read operation is absolutely identical to that in the first embodiment. In a data read operation, on the other hand, the word line 182 is converted to a high level, so that the transistor 121 enters a cutoff state and the transistor 131 enters a conducting state. Thus, a logical level which is complementary to that at another terminal 201b of the memory circuit 21 is outputted from the output terminal 203 of the NAND gate.

Namely, when the terminals 201a and 201b of the memory circuit 21 are at low and high logical levels respectively, the transistor 122 enters a cutoff state and the transistor 132 enters a conducting state, so that the logical level at the output terminal 203 of the NAND gate goes high. Thus, the transistor 123 enters a conducting state.

On the other hand, the transistor 133 is in a cutoff state, whereby the bit line 192 is driven to the VDD potential to read high-level data.

When the terminals 201a and 201b of the memory circuit 21 are at high and low levels respectively, on the other hand, the transistor 122 enters a conducting state and the transistor 132 enters a cutoff state, whereby the logical level at the output terminal 203 of the NAND gate goes high. Thus, the transistor 123 enters a cutoff state.

On the other hand, the transistor 133 is in a conducting state, whereby the bit line 192 is driven to the GND potential, to read low-level data.

The bit line 192 is connected with a sense amplifier (not shown) directly or through a transfer gate, to drive the read data to a circuit in a next stage. The data read operation is completed in the aforementioned manner.

After the completion of the data read operation, the word line 182 is converted to a low level, so that the transistor 121 enters a conducting state and the transistor 131 enters a cutoff state. Namely, the logical level at the output terminal 203 of the NAND gate goes high and the transistor 123 enters a cutoff state. On the other hand, the transistors 131 and 123 are in cutoff states, whereby the bit line 192 is electrically disconnected from the read buffer circuit 223 not only when the transistor 133 is in a cutoff state but when the transistor 133 is in a conducting state.

The circuit according to the third embodiment also performs the same operation as those of the first and second embodiments, whereby a similar effect can be attained.

Similarly to the first embodiment, the gate of the transistor 133 may be connected to the output terminal 203 of the NAND gate, as a matter of course.

It is also possible to obtain a modification which is similar to those of the first and second embodiments. The NOR gate 15i in the modification of the second embodiment shown in FIG. 6 may be formed by transistors, one of which also serves as the transistor 134i.

Figure 8:
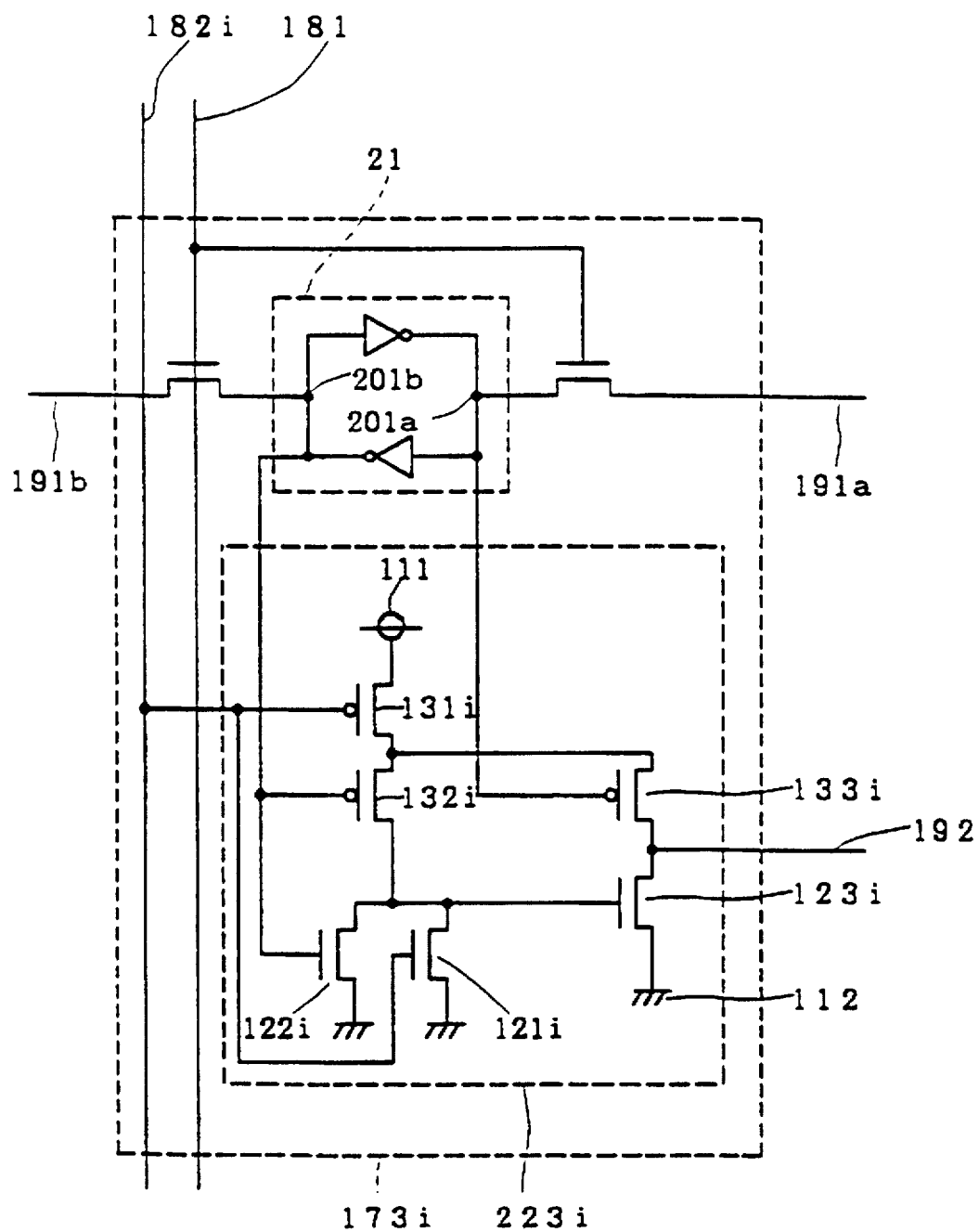
FIG. 8 is a circuit diagram showing the structure of a modification of the third embodiment according to the present invention.

FIG. 8 is a circuit diagram showing a memory cell circuit 173i according to modification of the third embodiment, which is aimed at improving operating speeds in N-channel MOS transistors. N-channel MOS transistors 121i and 122i and P-channel MOS transistors 131i and 132i form a NOR gate. The transistor 131i also serves as the transistor 134i in the modification of the second embodiment shown in FIG. 6.

Similarly to the third embodiment which can attain an effect similar to that of the second embodiment through a similar operation, the modification of the third embodiment can attain an effect similar to that of the modification of the second embodiment through a similar operation.

(B-4) Fourth Embodiment

Figure 9:
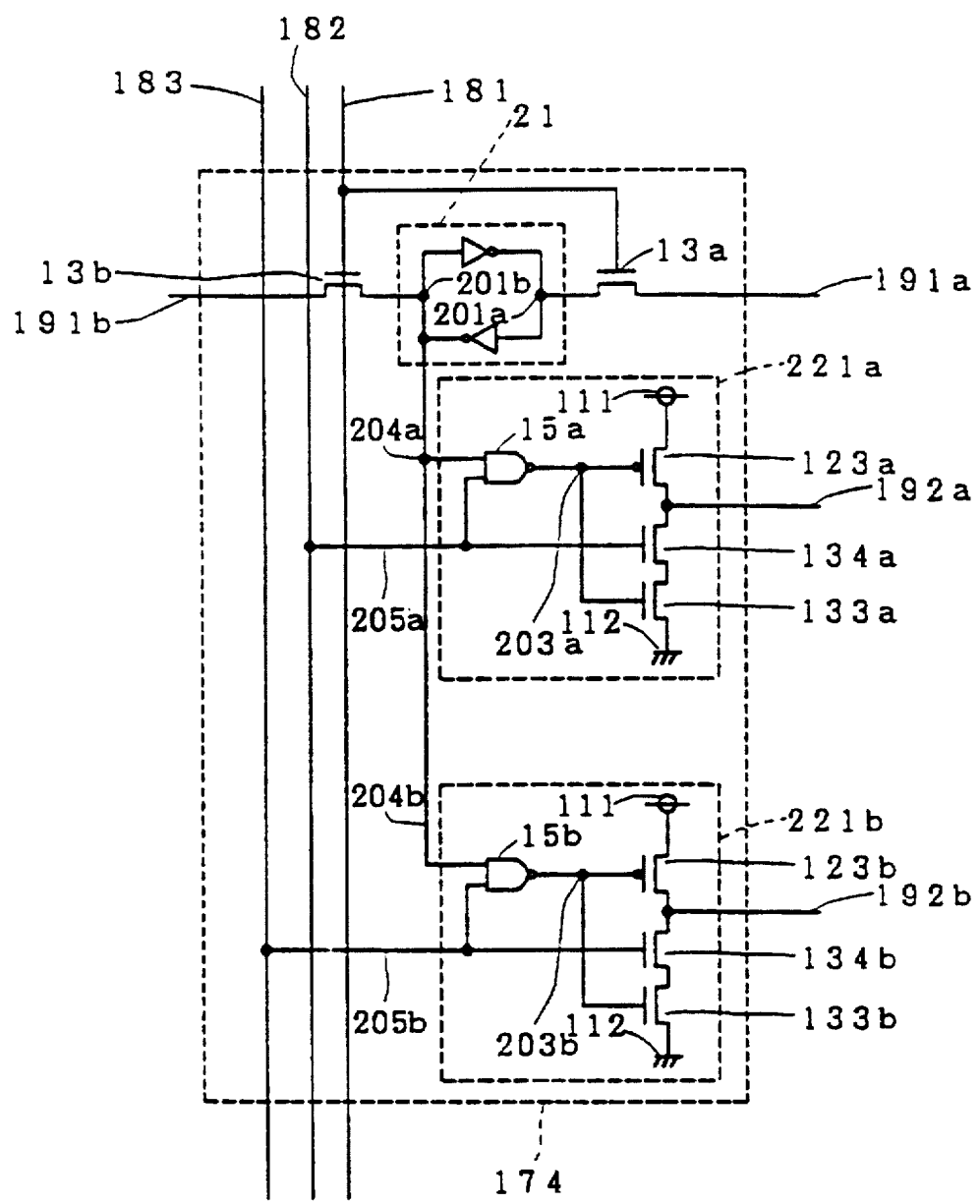
FIG. 9 is a circuit diagram showing the structure of a fourth embodiment according to the present invention.

FIG. 9 is a circuit diagram showing a memory cell circuit 174 of a multiport memory cell having a single write port and two read ports. This memory cell circuit 174, which is similar to the memory cell circuit 171 according to the first embodiment, is provided with a plurality of read buffer circuits.

The memory cell circuit 174 comprises a memory circuit 21, and read buffer circuits 221a and 221b. The memory circuit 21 is formed in a similar manner to that of the first embodiment.

The read buffer circuit 221a is formed by a NAND gate 15a, a P-channel MOS transistor 123a, and N-channel MOS transistors 133a and 134a. The transistor 123a has a source which is connected to a power supply line 111 to be supplied with a VDD potential. The transistor 134a has a source which is connected to a drain of connected to a drain of the transistor 133a, which in turn has a source connected to a grounding conductor 112 to be supplied with a GND potential.

The transistors 123a and 134a have drains which are connected to a bit line 192a in common. The transistors 123a and 133a have gates which are connected to an output terminal 203a of the NAND gate 15a in common. The transistor 134a has a gate which is connected to a read word line 182, while the NAND gate 15a has an input terminal 204a which is connected with a terminal 201b of the memory circuit 21 and another input terminal 205a which is connected with a gate of the transistor 134a.

Similarly, the read buffer circuit 221b is formed by a NAND gate 15b, a P-channel MOS transistor 123b, and N-channel MOS transistors 133b and 134b. The transistor 123b has a source which is connected to the power supply line 111 to be supplied with the VDD potential. The transistor 134b has a source which is connected to a drain of the transistor 133b, which in turn has a source connected to the grounding conductor 112 to be supplied with the GND potential.

The transistors 123b and 134b have drains which are connected to the bit line 192b in common. The transistors 123b and 133b also have gates which are connected to an output terminal 203b of the NAND gate 15b in common. The transistor 134b has a gate which is connected to a read word line 183, while the NAND gate 15b has an input terminal 204b which is connected with the terminal 201b of the memory circuit 21 and another input terminal 205b which is connected with a gate of the transistor 134b.

In operation of the memory cell circuit 174, data are written absolutely in the same manner as that in the first embodiment. A data read operation is now briefly described.

The word lines 182 and 183 may simultaneously go high with no problem since the same correspond to independent ports respectively. The word line 181 also corresponds to still another independent port, whereby write and read operations can be simultaneously performed.

When the read word line 182 is converted to a high level, data held in the terminal 201b of the memory circuit 21 is outputted on the read bit line 192a. When the read word line 183 is converted to a high level, on the other hand, data held in the terminal 201b of the memory circuit 21 is outputted to the read bit line 192b.

The detail of the read operation is similar to that with the read buffer circuit 221 according to the first embodiment, whereby an effect similar to that of the first embodiment can be attained.

(B-5) Fifth Embodiment

Figure 10:
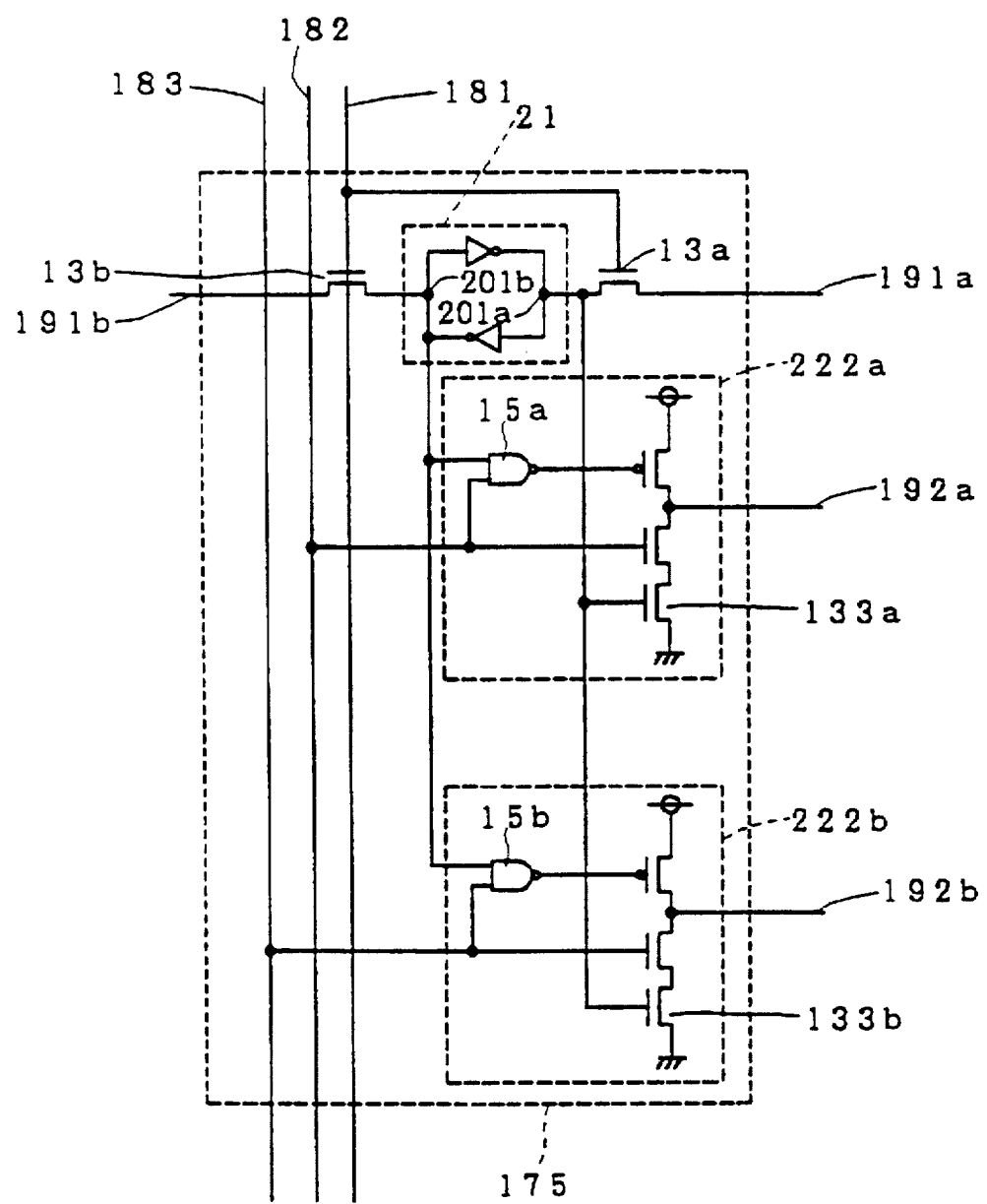
FIG. 10 is a circuit diagram showing the structure of a fifth embodiment according to the present invention.

FIG. 10 is a circuit diagram showing a memory cell circuit 175 of a multiport memory having one write port and two read ports. This memory cell circuit 175, which is similar to the memory cell circuit 172 according to the second embodiment, is provided with a plurality of read buffer circuits.

According to the fifth embodiment, gates of transistors 133a and 133b, which are connected to the respective output terminals 203a and 203b of the NAND gates 15a and 15b in the fourth embodiment, are connected to a terminal 201a of a memory circuit 21 in common. In other words, the relation of the fifth embodiment to the second embodiment is equivalent to that of the fourth embodiment to the first embodiment.

A data write operation of the memory cell circuit 175 is absolutely similar to that of the first embodiment. A data read operation is now briefly described.

Similarly to the fourth embodiment, word lines 182 and 183 may simultaneously go high since the same independently correspond to different ports respectively. Still another word line 181 also corresponds to still another independent port, whereby data write and read operations can be simultaneously performed.

When the read word line 182 is converted to a high level, data stored in the terminal 201b of the memory circuit 21 is outputted to a read bit line 192a. When the read word line 183 is converted to a high level, on the other hand, the data stored in the terminal 201b of the memory circuit 201a is outputted to another read bit line 192b.

The detail of the data read operation is similar to that of the second embodiment. Thus, an effect similar to that of the second embodiment can be attained.

(B-6) Sixth Embodiment

Figure 11:
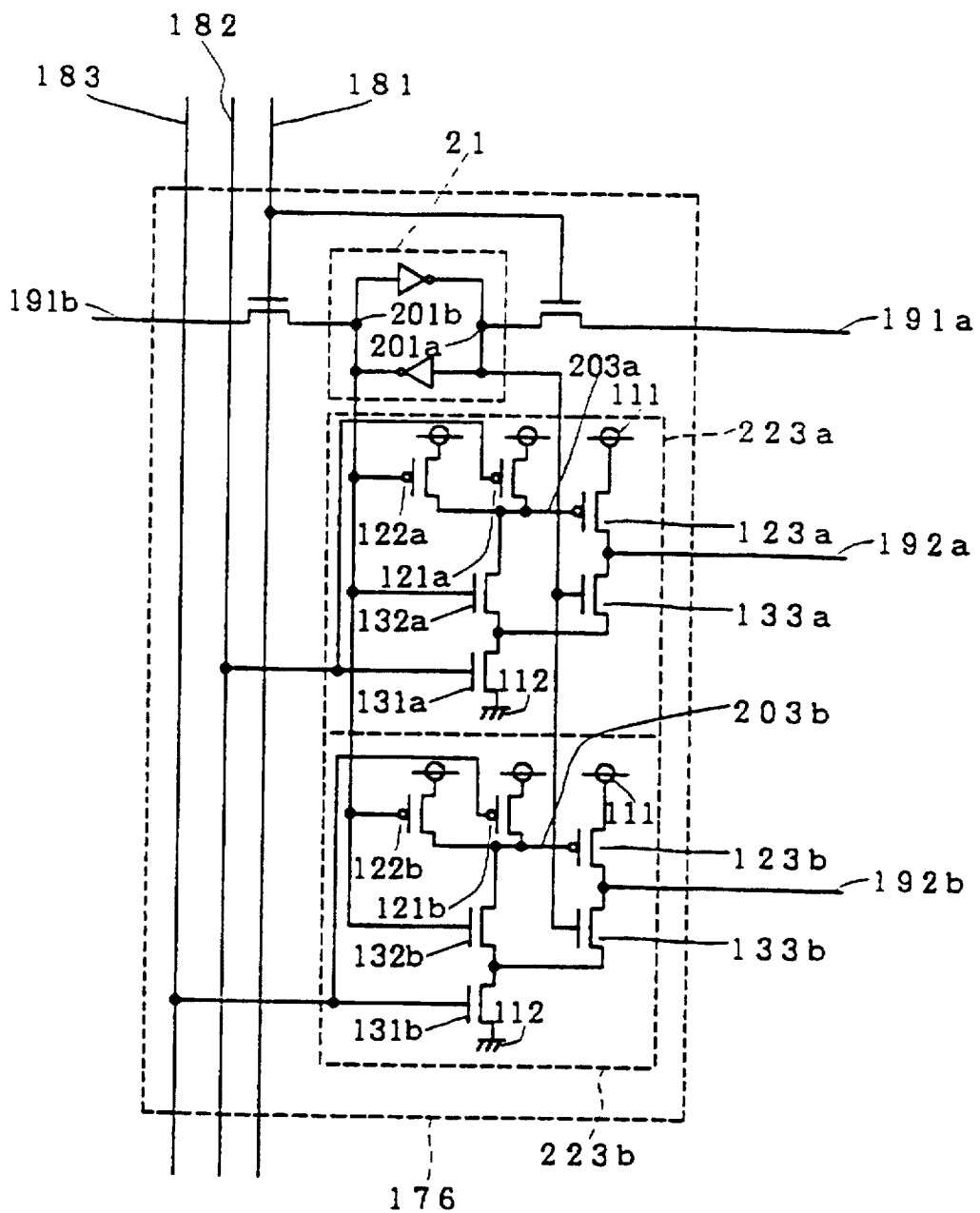
FIG. 11 is a circuit diagram showing the structure of a sixth embodiment according to the present invention.

FIG. 11 is a circuit diagram showing a memory cell circuit 176 of a multiport memory having one write port and two read ports. This memory cell circuit 176, which is similar to the memory cell circuit 173 according to the third embodiment, is provided with a plurality of read buffer circuits.

According to the sixth embodiment, portions corresponding to the NAND gates 15a and 15b of the fourth embodiment are formed by transistors respectively. In other words, the relation of the sixth embodiment to the third embodiment is equivalent to that of the fourth embodiment to the first embodiment.

The circuit structure of the memory cell circuit 176 is now described. This memory cell circuit 176 comprises a memory circuit 21 and read buffer circuits 223a and 223b.

The memory circuit 21 is formed similarly to the first embodiment. In the read buffer circuit 223a, P-channel MOS transistors 121a and 122a and N-channel MOS transistors 131a and 132a are connected in the manner shown in FIG. 3, to form a NAND gate.

The transistors 122a and 132a have gates which are connected to a terminal 201b of the memory circuit 21 in common, while the transistors 121a and 131a have gates which are connected to a read word line 182 in common.

A P-channel MOS transistor 123a has a source which is connected to a power supply line 111 to be supplied with a VDD potential, while an N-channel MOS transistor 133a has a source which is connected to a drain of the transistor 131a. The transistors 123a and 133a have drains which are connected to a bit line 192a in common. The transistor 123a has a gate which is connected to a terminal 203a, serving as an output terminal of the NAND gate, while the transistor 133a has a gate which is connected to a terminal 201a of the memory circuit 21. The read buffer circuit 223a is formed in the aforementioned manner.

Similarly, P-channel MOS transistors 121b and 122b and N-channel MOS transistors 131b and 132b are connected in the manner shown in FIG. 3 in the read buffer circuit 223b, to form a NAND gate.

The transistors 122b and 132b have gates which are connected to the terminal 201b of the memory circuit 21 in common, while the transistors 121b and 131b have gates which are connected to a read word line 183 in common.

A P-channel MOS transistor 123b has a source which is connected to the power supply line 111 to be supplied with the VDD potential, while an N-channel MOS transistor 133b has a source which is connected to a drain of the transistor 131b. The transistors 123b and 133b have drains which are connected to a bit line 192b in common. The transistor 123b has a gate which is connected to a terminal 203b serving as an output terminal of the NAND gate, while the transistor 133b has a gate which is connected to the terminal 201a of the memory circuit 21. The read buffer circuit 223b is formed in the aforementioned manner.

In the memory cell circuit 176, a data write operation is absolutely identical to that of the first embodiment. A data read operation is now briefly described.

When the read word line 182 is converted to a high level, data held in the terminal 201b of the memory circuit 21 is outputted to the read bit line 192a. When the read word line 183 is converted to a high level, on the other hand, the data held in the terminal 201b of the memory circuit 21 is outputted to the read bit line 192b.

Similarly to the fourth and fifth embodiments, the word lines 182 and 183 may simultaneously go high with no problem since the same independently correspond to different ports respectively. Since still another word line 181 corresponds to still another independent port, further, read and write operations can be simultaneously performed.

The detail of the read operation is similar to that of the third embodiment, whereby it is possible to attain an effect similar to that of the third embodiment.

(B-7) Seventh Embodiment

Figure 12:
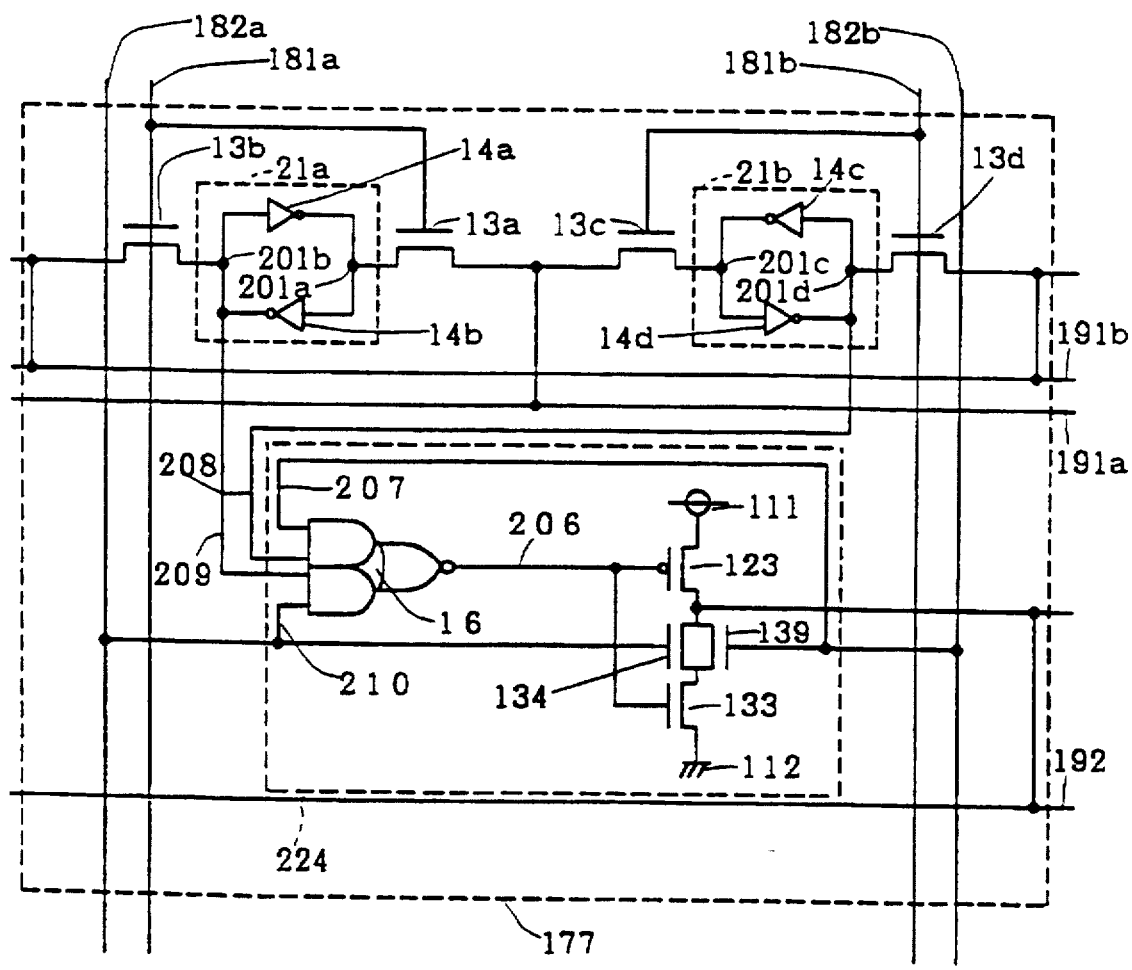
FIG. 12 is a circuit diagram showing the structure of a seventh embodiment according to the present invention.

FIG. 12 is a circuit diagram showing the structure of a memory cell circuit 177 of a multiport memory having a write port and a read port.

This memory cell circuit 177 comprises memory circuits 21a and 21b, and a read buffer circuit 224.

The memory circuit 21a is formed by a flip-flop circuit including inverter circuits 14a and 14b whose output terminals 201a and 201b are connected to input terminals of the counter inverter circuits 14b and 14a, to store data.

Similarly, the other memory circuit 21b is formed by a flip-flop circuit including inverter circuits 14c and 14d whose output terminals 201c and 201d are connected to input terminals of the counter inverter circuits 14d and 14c, to store data.

The memory circuits 21a and 21b, which are provided with write access gates for writing data being received in the write port in the memory circuits 21a and 21b, are connected with write bit lines 191a and 191b for transferring write data, and write word lines 181a and 181b for selecting desired ones of the memory circuits 21a and 21b.

The write access gates are formed by N-channel MOS transistors 13a, 13b, 13c and 13d. The transistors 13a and 13b have drains which are connected to the terminals 201a and 201b of the memory circuit 21a respectively, sources which are connected to the write bit lines 191a and 191b respectively, and gates which are connected to the write word line 181a in common.

Similarly, the transistors 13c and 13d have drains which are connected to the terminals 201c and 201d of the memory circuit 21b respectively, sources which are connected to the bit lines 191a and 191b respectively, and gates which are connected to the word line 181b in common.

The read buffer circuit 224, which is adapted to read the data stored in the memory circuit 21a and 21b, is connected with a read bit line 192 for transferring read data, and read word lines 182a and 182b for selecting desired ones of the memory circuits 21a and 21b in the memory cell circuit 177.

The read buffer circuit 224 is formed by AND gates and a NOR gate which are represented by an AND-NOR composite circuit 16, a P-channel MOS transistor 123, and N-channel MOS transistors 133, 134 and 139.

The transistor 123 has a source which is connected to a power supply line 111, to be supplied with a VDD potential. The transistor 133 has a source which is connected to a grounding conductor 112, to be supplied with a GND potential.

The transistors 134 and 139 have sources which are connected with a drain of the transistor 133 in common. The transistors 123, 134 and 139 have drains which are connected to the bit line 192 in common.

The transistors 123 and 133 have gates which are connected to an output terminal 206 of the AND-NOR composite circuit 16 in common. The transistors 134 and 139 have gates which are connected to the word lines 182a and 182b respectively.

The AND-NOR composite circuit 16 has a pair of AND input terminals 209 and 210, which are connected with the terminal 201b of the memory circuit 21a and the gate of the transistor 134 respectively, and another pair of AND input terminals 207 and 208 which are connected with the gate of the transistor 139 and the terminal 201d of the memory circuit 21b respectively.

Figure 13:
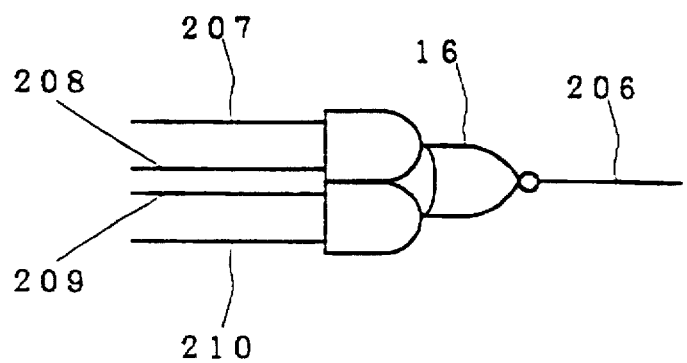
FIG. 13 is a logic symbol diagram of an AND-NOR composite circuit.
Figure 14:
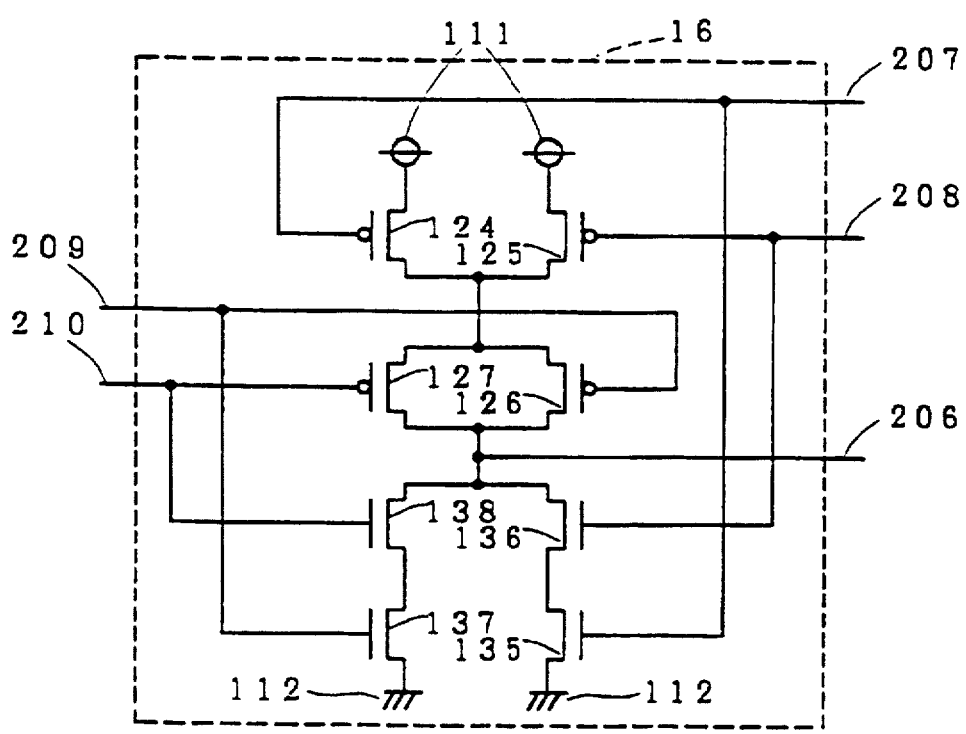
FIG. 14 is a circuit diagram showing an exemplary structure of an AND-NOR composite circuit.

FIGS. 13 and 14 illustrate the structure and the operation of the AND-NOR composite circuit 16 shown in FIG. 12. FIG. 13 is a logic symbol diagram of the AND-NOR composite circuit 16, and FIG. 14 is a circuit diagram showing an exemplary structure of the AND-NOR composite circuit 16 formed by MOS transistors.

The circuit structure of the AND-NOR composite circuit 16 is now described with reference to FIG. 14.

Referring to FIG. 14, P-channel MOS transistors 124 and 125 have sources which are connected to the power supply line 111, to be supplied with the VDD potential. These transistors 124 and 125 have drains which are connected in common with sources of P-channel MOS transistors 126 and 127. The transistors 126 and 127 have drains which are connected in common with drains of N-channel MOS transistors 136 and 138, to form the output terminal 206.

The transistor 136 has a source which is connected to a drain of the transistor 135. The transistor 135 has a source which is connected to the grounding conductor 112, to be supplied with the GND potential. The transistor 138 has a source which is connected to a drain of the transistor 137. The transistor 137 has a source which is connected to the grounding conductor 112 to be supplied with the GND potential.

Gates of the transistors 124 and 135, 125 and 136, 126 and 137, and 127 and 138 are connected with each other in common respectively, to form input terminals 207, 208, 209 and 210 respectively. The AND-NOR composite circuit 16 is formed in the aforementioned manner.

The operation of the AND-NOR composite circuit 16 is now described. When both of the input terminals 207 and 208 are supplied with high-level data (VDD potential), the transistors 124 and 125 enter cutoff states and the transistors 135 and 136 enter conducting states. Thus, the output terminal 206 is driven to the GND potential regardless of logical levels which are supplied to the input terminals 209 and 210, to output low-level data.

When both of the input terminals 209 and 210 are similarly supplied with high-level data (VDD potential), the transistors 126 and 127 enter cutoff states and the transistors 137 and 138 enter conducting states. Thus, the output terminal 206 is driven to the GND potential regardless of values of the input terminals 207 and 208, to output low-level data.

When at least one of the input terminals 207 and 208 is supplied with low-level data and at least one of the input terminals 209 and 210 is also supplied with low-level data, at least one of the transistors 124 and 125 and at least one of the transistors 126 and 127 enter conducting states and at least one of the transistors 135 and 136 and at least one of the transistors 137 and 138 enter cutoff states. Thus, the output terminal 206 is driven to the VDD potential, to output high-level data.

Namely, the AND-NOR composite 16 so operates that the output terminal 206 is supplied with a low logical level when both of the input terminals 207 and 208 or both of the input terminals 209 and 210 are supplied with high-level data while high-level data is outputted from the output terminal 206 when the terminals are supplied with other data.

Referring again to FIG. 12, the operation of the memory cell circuit 177 is now described. A data write operation is similar to that of the fist embodiment. First, the bit lines 191a and 191b are driven to low or high levels in response to the logical level of write data through a write driver circuit (not shown) which is connected to the bit lines 191a and 191b. At this time, the bit lines 191a and 19b are driven to be in a complementary relation to each other.

When data is written in the memory circuit 21a, the word line 181a is driven to a high level. Since no word lines of the same port rise at the same time, the word line 181b remains at a low level. At this time, the access gates 13a and 13b of the memory circuit 21 enter conducting states, while the access gates 13c and 13d of the memory circuit 21b enter cutoff states.

Thus, the terminals 201a and 201b of the memory circuit 21a are electrically connected with the bit lines 191a and 191b respectively, so that the data is written in the memory circuit 21a. Similarly, the word line 181b is converted to a high level and the word line 181a is converted to a low level when data is written in the memory circuit 21b. The data write operation is completed in the aforementioned manner.

A data read operation is now described. In order to read data stored in the memory circuit 21a, the word line 182a is converted to a high level and the transistor 134 forming the read buffer circuit 224 is brought into a conducting state. At this time, a logical level which is supplied to the input terminal 210 connected to the gate of the transistor 134 of the AND-NOR composite circuit 16 also goes high.

Since no word lines of the same port rise at the same time, the word line 182b is driven to a low level. Therefore, the input terminal 207 is at a low logical level, whereby a logical level which is complementary to that supplied to the terminal 201b of the memory circuit 21a is outputted from the output terminal 206 of the AND-NOR composite circuit 16.

If the terminal 201b of the memory circuit 21 is supplied with a high logical level, for example, the output terminal 206 of the AND-NOR composite circuit 16 is supplied with a low logical level. Thus, the transistor 123 enters a conducting state and the transistor 133 enters a cutoff state, whereby the bit line 192 is driven to the VDD potential so that high-level data is read out.

If the terminal 201b is supplied with a low logical level, on the other hand, the output terminal 206 of the AND-NOR composite circuit 16 is supplied with a high logical level. Thus, the transistor 123 enters a cutoff state and the transistor 133 enters a conducting state while the transistor 134 is also in a conducting state, whereby the bit line 192 is driven to the GND potential so that low-level data is read out.

The bit line 192 is connected with a sense amplifier circuit (not shown) directly or through a transfer gate, so that the read data is driven to a circuit of a next stage. Data stored in the memory circuit 21a is completely read out in the aforementioned operation.

In order to read data stored in the memory circuit 21b, the word line 182b is converted to a high level (the word line 182a is converted to a low level).

After completion of the data read operation, both word lines 182a and 182b are converted to low levels so that both input terminals 207 and 210 are supplied with low logical levels, whereby the value at the output terminal 206 of the AND-NOR composite circuit 16 goes high to bring the transistor 123 into a cutoff state. The transistors 134 and 139 also enter cutoff states, whereby the bit line 192 is electrically disconnected from the read buffer circuit 224.

As hereinabove described, the present invention is also applicable to a plurality of write ports, to attain an effect similar to that of the first embodiment.

While this embodiment comprises the two memory circuits 21a and 21b, the bit line 192 is pulled up by the single transistor 123. Thus, the capacity of read bit lines for each memory means can be reduced as compared with the prior art. Therefore, the operation can be performed at a higher speed, to reduce the access time. Further, charge/discharge currents flowing in the read bit lines are also reduced to save the power.

It is possible to improve an N-channel MOS transistor in speed, in a similar manner to the modification of the first embodiment.

Figure 15:
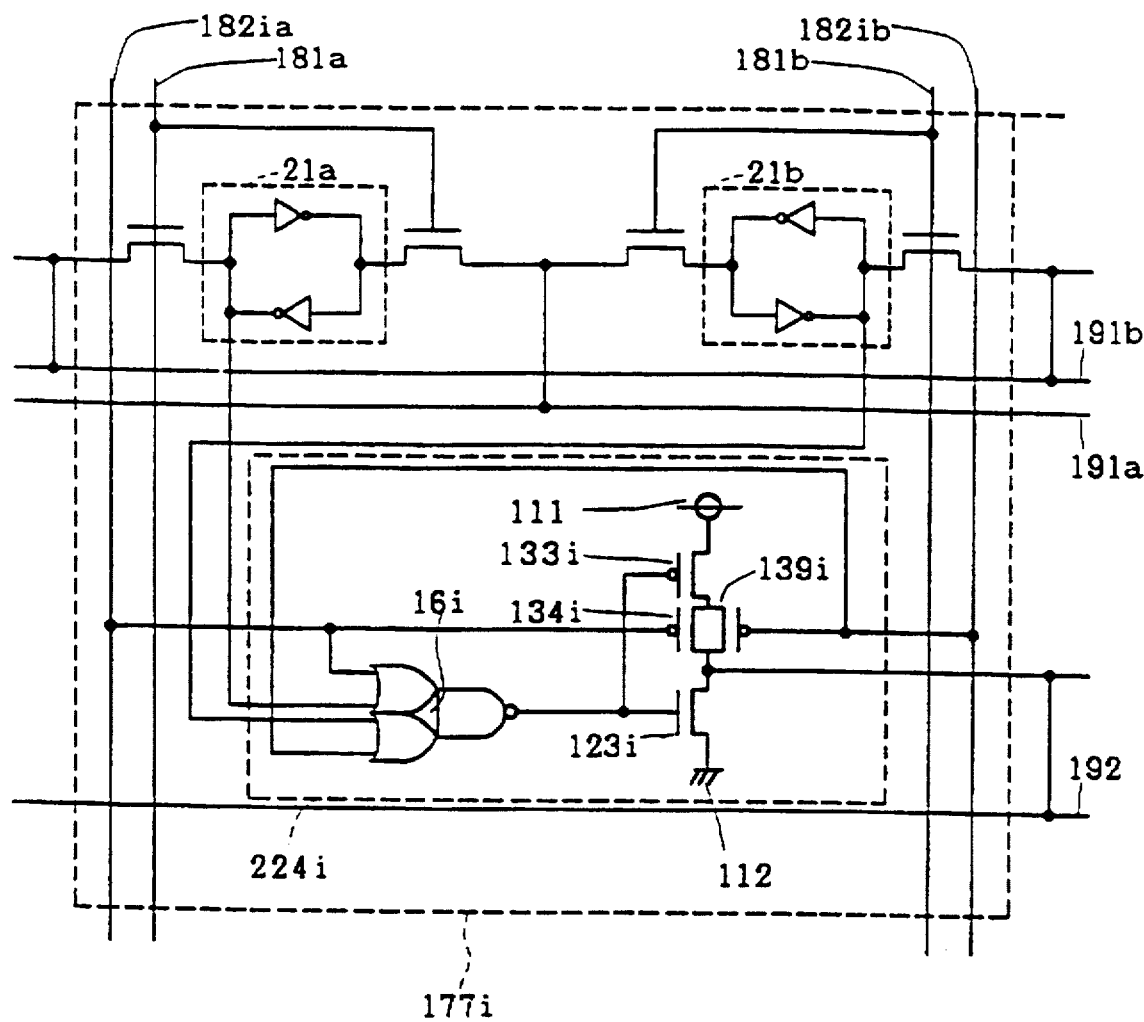
FIG. 15 is a circuit diagram showing the structure of a modification of the seventh embodiment according to the present invention.

FIG. 15 is a circuit diagram showing a modification of the seventh embodiment. In a read buffer circuit 224i, an output of an OR-NAND composite circuit 16i is supplied to gates of an N-channel MOS transistor 123i and a P-channel MOS transistor 133i in common. P-channel MOS transistors 134i and 139i, which are connected in series to the transistor 133i, have gates which are connected with read word lines 182ia and 182ib respectively.

The read word lines 182ia and 182ib are supplied with signals for driving the read buffer circuit 224i at a low level, whereby the read buffer circuit 224i performs an operation which is complementary to that of the read buffer circuit 224 shown in FIG. 12. Therefore, a memory cell circuit 177i comprising the read buffer circuit 224i and memory circuits 21a and 21b can also attain an effect similar to that of the seventh embodiment, i.e., similar to that of the first embodiment.

(B-8) Eighth Embodiment

Figure 16:
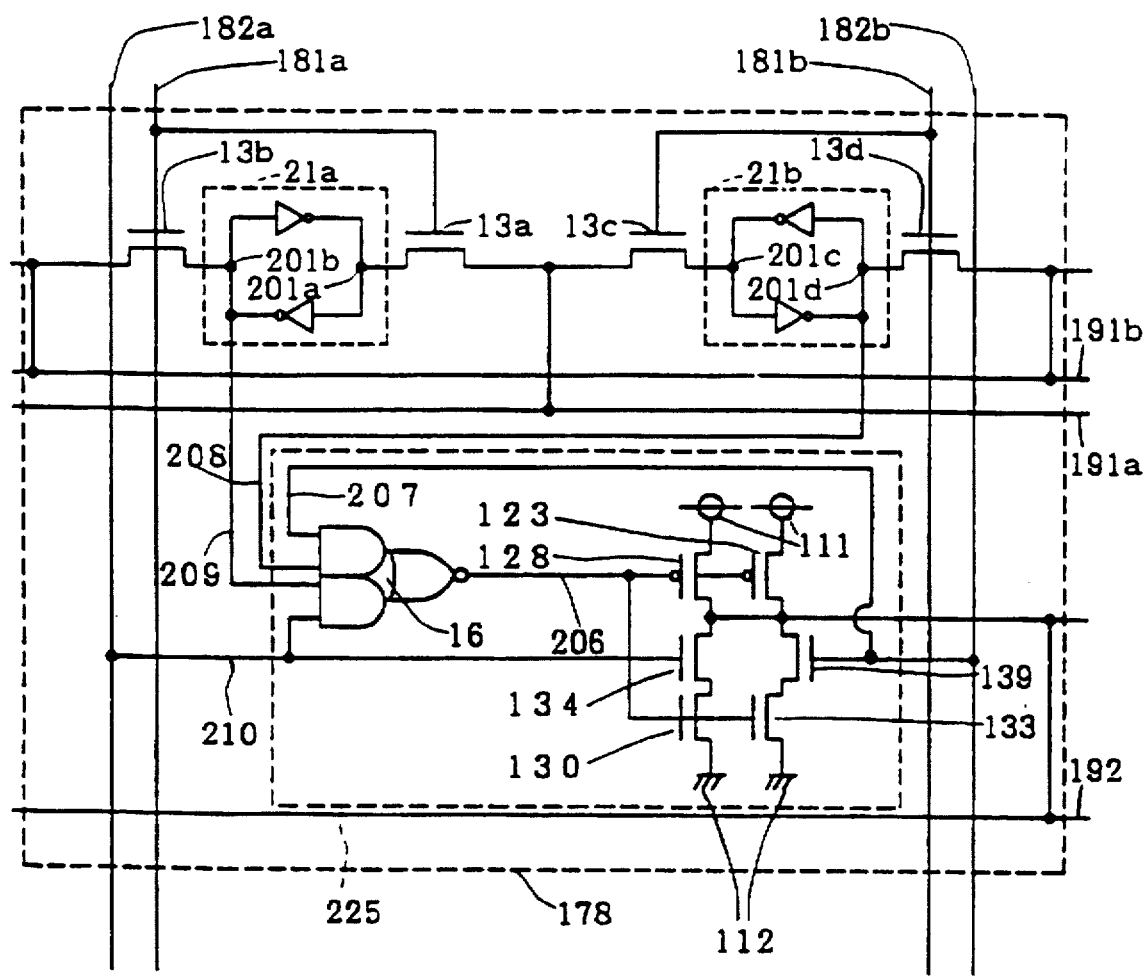
FIG. 16 is a circuit diagram showing the structure of an eighth embodiment according to the present invention.

FIG. 16 is a circuit diagram showing the structure of a memory cell circuit 178 of a multiport memory having a single write port and a single read port.

The memory cell circuit 178 comprises memory circuits 21a and 21b and a read buffer circuit 225. The structure of this embodiment is identical to that of the memory cell circuit 177 according to the seventh embodiment shown in FIG. 12, except the structure of the read buffer circuit 225.

The read buffer circuit 225 is formed by AND gates and a NOR gate which are expressed as an AND-NOR composite circuit 16. P-channel MOS transistors 123 and 128 and N-channel MOS transistors 133, 134, 139 and 130.

The transistors 123 and 128 have sources which are connected to a power supply line 111 in common, to be supplied with a VDD potential. The transistors 133 and 130 have sources which are connected to a grounding conductor 112, to be supplied with a GND potential.

The transistors 134 and 139 have sources which are connected with drains of the transistor 130, 133, respectively. The transistors 123, 128, 134 and 139 have drains which are connected to a bit line 192 in common.

The transistors 123, 128, 133 and 130 have gates which are connected to an output terminal 206 of the AND-NOR composite circuit 16 in common. The transistors 134 and 139 have gates which are connected to word lines 182a and 182b respectively.

The AND-NOR composite circuit 16 has a pair of AND input terminals 209 and 210 which are connected with a terminal 201b of the memory circuit 21a and a gate of the transistor 134 respectively. Another pair of AND input terminals 207 and 208 are connected with a gate of the transistor 139 and a terminal 201d of the memory circuit 21b respectively.

The transistor 123 in the read buffer circuit 224 of the seventh embodiment is replaced by parallel connection of the transistors 123 and 128 in the read buffer circuit 225 of the eighth embodiment, while the transistor 133 in the read buffer circuit 224 of the seventh embodiment is replaced by the transistors 133 and 130 in the read buffer circuit 225 of the eighth embodiment.

In other words, it can be said that the read buffer circuit 224 of the seventh embodiment has such a structure that transistors which can also be employed in the read buffer circuit 225 of the eighth embodiment are unified. In order to apply the present invention to a memory cell circuit having a plurality of memory means, either a single or a plurality of P-channel MOS transistors can be employed for pulling up the read bit line 192. When a plurality of P-channel MOS transistors are employed for the pullup operation as shown in the eighth embodiment, it is possible to improve ability for driving the bit line 192 to a high level.

The operation of the memory cell circuit 178 is now described. A data write operation is absolutely similar to that shown in the seventh embodiment.

A data read operation is now described.

In order to read data stored in the memory circuit 21a, the word line 182a is converted to a high level so that the transistor 134 forming the read buffer circuit 225 enters a conducting state. On the other hand, the input terminal 210 which is connected to the gate of the transistor 134 of the AND-NOR composite circuit 16 also enters a high logical level state.

The word line 182b is driven to a low level since word lines of the same port will not rise at the same time. Therefore, the input terminal 207 is supplied with a low logical level, so that a logical level which is complementary to that supplied to the terminal 201b of the memory circuit 21 is outputted from the output terminal 206 of the AND-NOR composite circuit 16.

When the terminal 201b of the memory circuit 21a is supplied with a high logical level, for example, the output terminal 206 of the AND-NOR composite circuit 16 is supplied with a low logical level. Thus, the transistors 123 and 128 enter conducting states and the transistor 130 enters a cutoff state, whereby the bit line 192 is driven to the VDD potential so that high-level data is read out.

When the terminal 201b is supplied with a low logical level, on the other hand, the output terminal 206 of the AND-NOR composite circuit 16 is supplied with a high logical level. Thus, the transistors 123 and 128 enter cutoff states and the transistor 130 enters a conducting state. Since the transistor 134 is also in a conducting state, the bit line 192 is driven to the GND potential, so that low-level data is read out.

The bit line 192 is connected with a sense amplifier circuit (not shown) directly or through a transfer gate, so that the as-read data is driven to a circuit of a next stage. The data stored in the memory circuit 21a is completely read in the aforementioned manner.

Similarly, the word line 181b is driven to a high level in order to read data stored in the memory circuit 21b. In more concrete terms, the transistor 130 is replaced by the transistor 133 in the above description for the case of reading the data from the memory circuit 21a.

After completion of the data read operation, both of the word lines 182a and 182b are driven to low levels so that the output terminal 206 of the AND-NOR composite circuit 16 is supplied with a high logical level and the transistors 123 and 128 enter cutoff states. The transistors 134 and 139 also enter cutoff states, whereby the bit line 192 is electrically disconnected from the read buffer circuit 225.

The operation in the eighth embodiment is substantially similar to that in the seventh embodiment, whereby an effect similar to that of the seventh embodiment can be attained.

Similarly to the modification of the seventh embodiment, speeds of N-channel MOS transistors can be improved.

Figure 17:
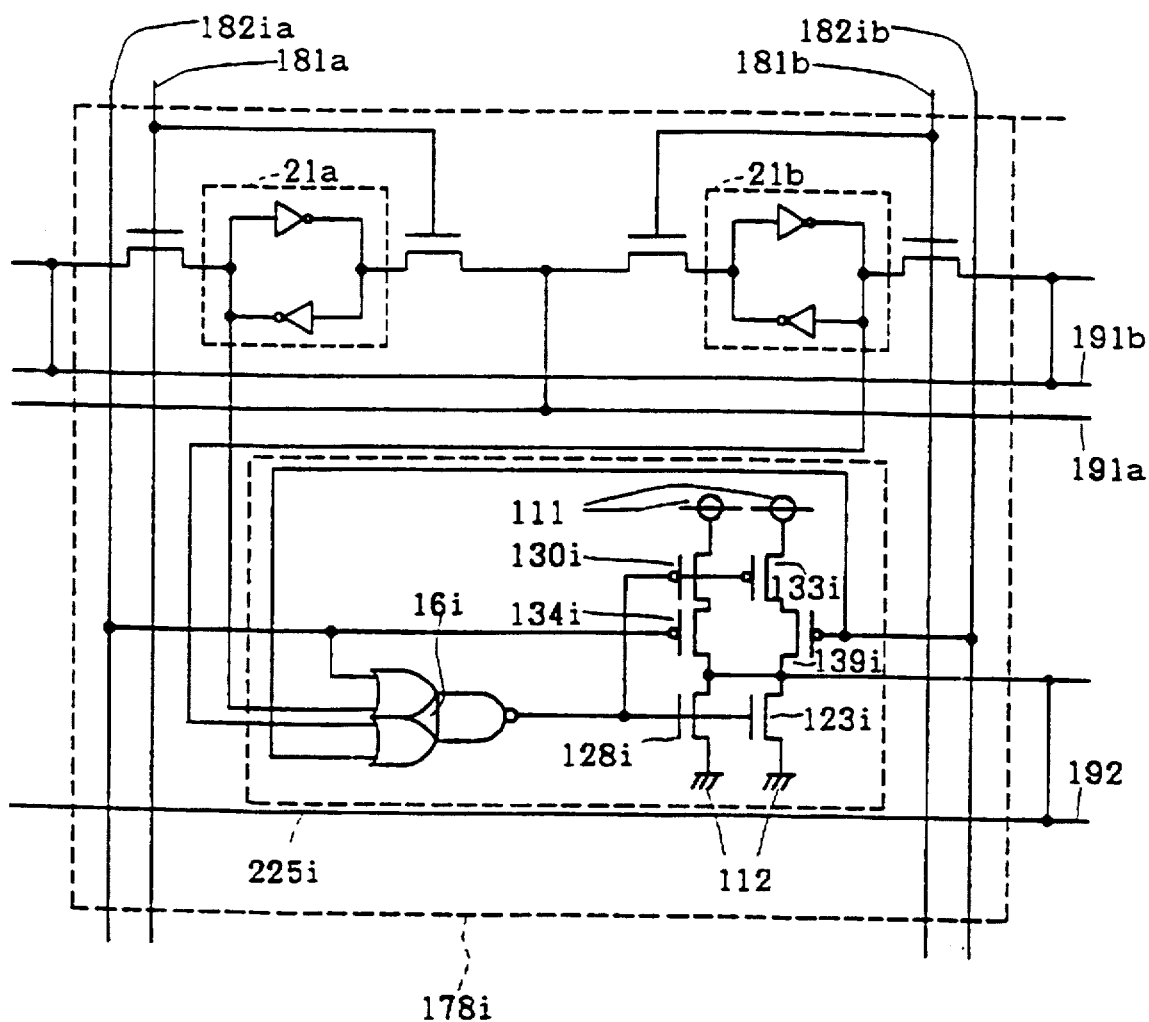
FIG. 17 is a circuit diagram showing the structure of a modification of the eighth embodiment according to the present invention.

FIG. 17 is a circuit diagram showing a modification of the eight embodiment. In a read buffer circuit 225i, an output of an OR-NAND composite circuit 16i is supplied to gates of N-channel MOS transistors 123i and 128i and P-channel MOS transistors 133i and 130i in common. A P-channel MOS transistor 134i which is connected in series to the transistor 130i has a gate which is connected with a read word line 182ia. A P-channel MOS transistor 139i which is connected in series to the transistor 133i has a gate which is connected with a read word line 182ib.

The read word lines 182ia and 182ib are supplied with signals for driving the read buffer circuit 225i at a low level, whereby the read buffer circuit 225i performs an operation which is complementary to that of the read buffer circuit 225 shown in FIG. 16. Thus, a memory cell circuit 178i comprising the read buffer circuit 225i and memory circuits 21a and 21b can attain an effect similar to that of the eighth embodiment.

(B-9) Ninth Embodiment

Figure 18:
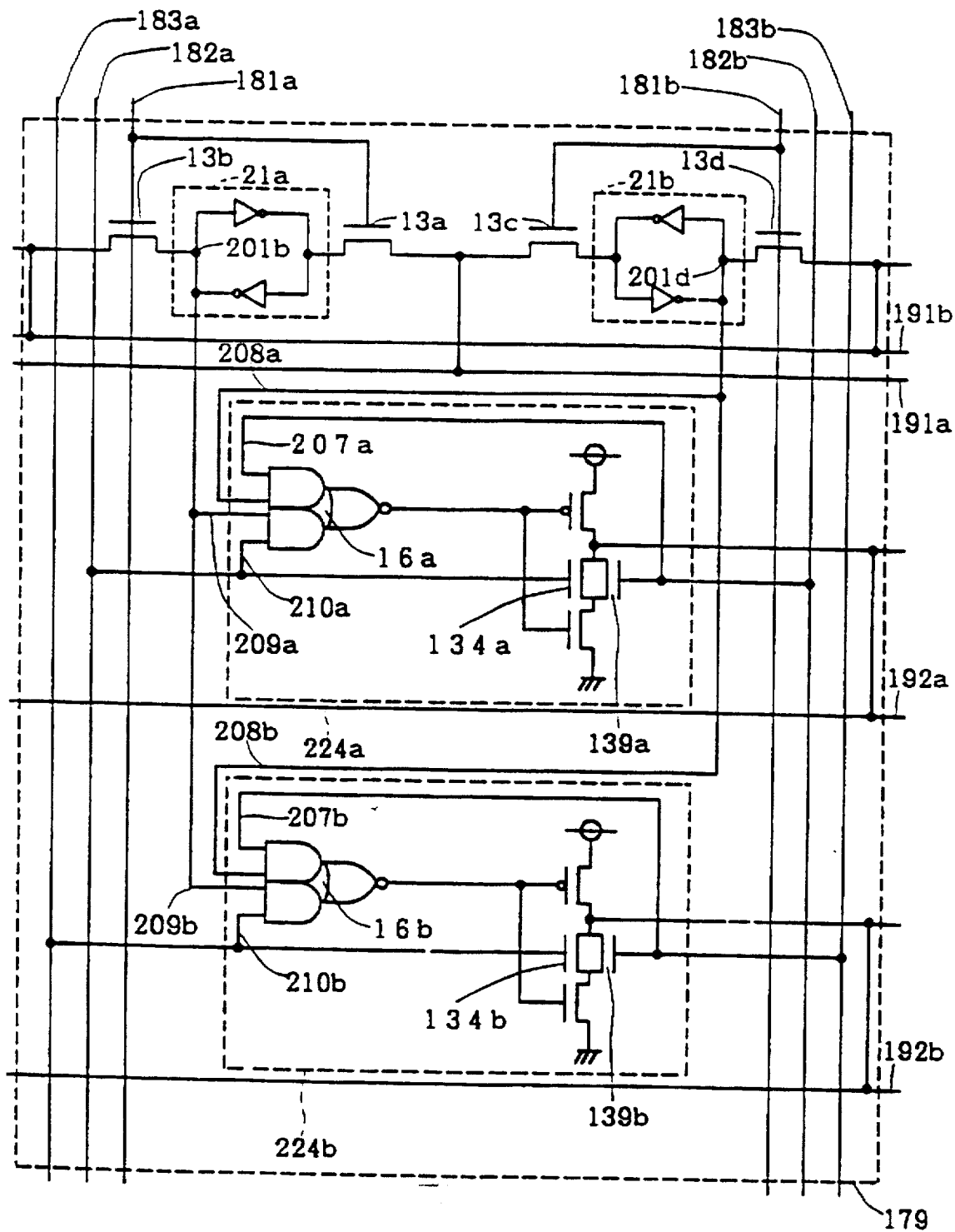
FIG. 18 is a circuit diagram showing the structure of a ninth embodiment according to the present invention.

FIG. 18 is a circuit diagram showing a memory cell circuit 179 of a multiport memory having one write port and two read ports. The ninth embodiment has a structure including a plurality of read buffer circuits provided in the memory cell circuit 177 shown in the seventh embodiment. In other words, the relation of the ninth embodiment to the seventh embodiment is equivalent to that of the fourth embodiment to the first embodiment.

The memory cell circuit 179 comprises memory circuits 21a and 21b and read buffer circuits 224a and 224b. The memory circuits 21a and 21b are formed similarly to those in the seventh embodiment. The read buffer circuits 224a and 224b are formed similarly to the read buffer circuit 224 shown in the seventh embodiment.

Transistors 134a and 139a of the read buffer circuit 224a have gates which are connected to word lines 182a and 182b respectively. A pair of AND input terminals 209a and 210a of an AND-NOR composite circuit 16a are connected with a terminal 201b of the memory circuit 21a and the gate of the transistor 134a respectively, while another pair of AND input terminals 207a and 208a are connected with the gate of the transistor 139a and a terminal 201d of the memory circuit 21b respectively.

Similarly, transistors 134b and 139b of the read buffer circuit 224b have gates which are connected to the word lines 183a and 183b respectively. A pair of AND input terminals 209b and 210b of another AND-NOR composite circuit 16b are connected with the terminal 201b of the memory circuit 21a and the gate of the transistor 134b respectively, while another pair of AND input terminals 207b and 208b are connected with the gate of the transistor 139b and the terminal 201d of the memory circuit 21b respectively.

An operation of the memory cell circuit 179 for writing data is absolutely identical to that of the seventh embodiment. A case of reading data is now briefly described.

When at least one of the read word lines 182a and 183a is converted to a high level, data held in the terminal 201b of the memory circuit 21a is read out. This data is outputted to a read bit line 192a when the read word line 182a is converted to a high level, while the same is outputted to another read bit line 192b when the read word line 183a is converted to a high level.

Similarly, one of the read word lines 182b and 183b is converted to a high level in order to read data held in the terminal 201d of the memory circuit 21b. This data is outputted to the read bit line 192a when the read word line 182b is converted to a high level. while the same is outputted to the read bit line 192b when the read word line 183b is converted to a high level.

A detailed read operation is similar to that shown in the seventh embodiment, whereby an effect of the ninth embodiment is obtained similarly to that of the seventh embodiment.

(B-10) Tenth Embodiment

Figure 19:
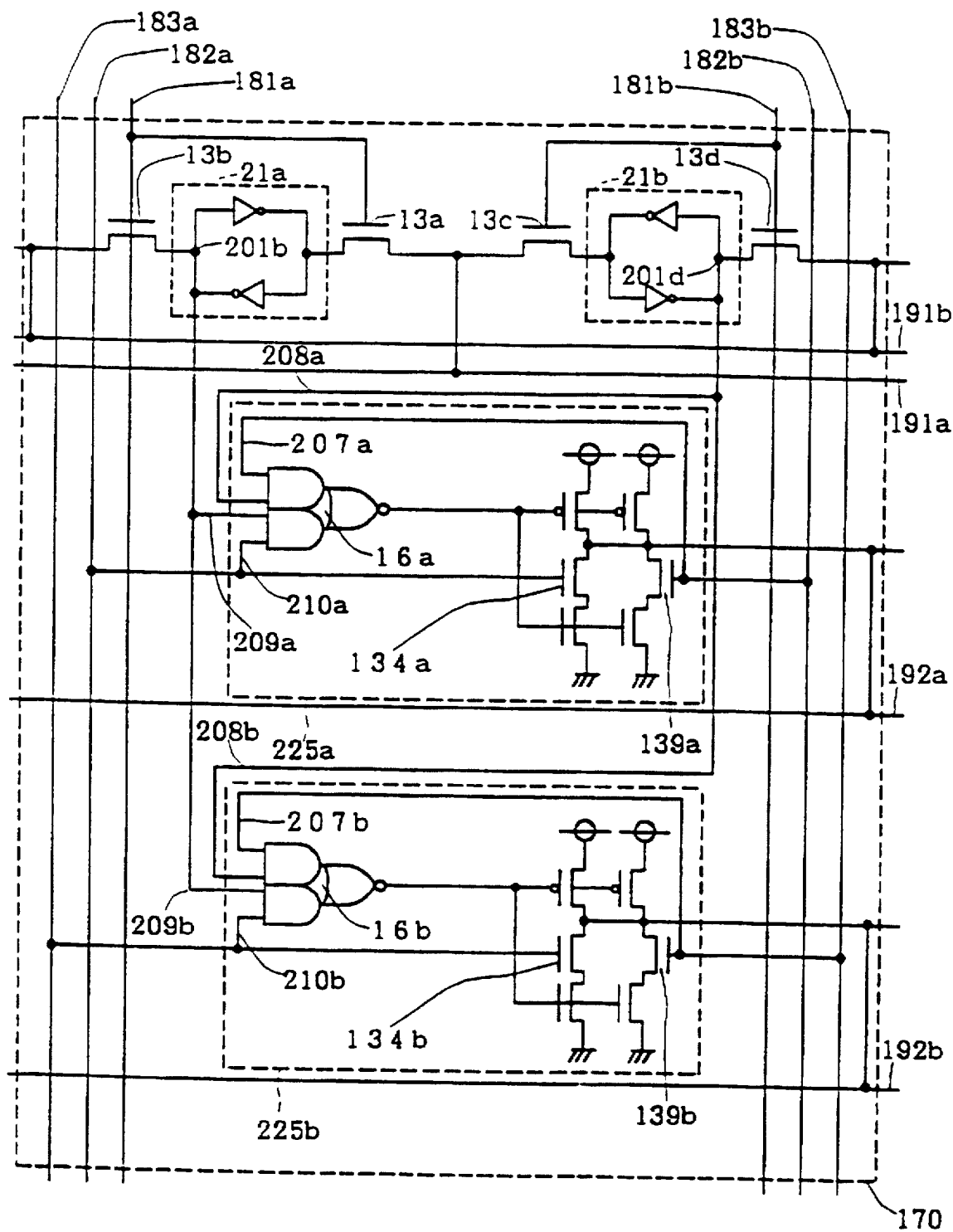
FIG. 19 is a circuit diagram showing the structure of a tenth embodiment according to the present invention.

FIG. 19 is a circuit diagram showing a memory cell circuit 170 of a multiport memory having one write port and two read ports. In the tenth embodiment, a plurality of read buffer circuits are provided in a circuit similar to the memory cell circuit 178 according to the eighth embodiment. In other words, the relation of the tenth embodiment to the eighth embodiment is equivalent to that of the fourth embodiment to the first embodiment.

The memory cell circuit 170 comprises memory circuits 21a and 21b and read buffer circuits 225a and 225b. The memory circuits 21a and 21b are formed similarly to those in the seventh embodiment. The read buffer circuits 225a and 225b are also formed similarly to the read buffer circuit 225 according to the eighth embodiment.

Transistors 134a and 139a of the read buffer circuit 225a have gates which are connected to word lines 182a and 182b respectively. A pair of AND input terminals 209a and 210a of an AND-NOR composite circuit 16a are connected with a terminal 201b of the memory circuit 21a and the gate of the transistor 134a respectively, while another pair of AND input terminals 207a and 208a are connected with the gate of the transistor 139a and a terminal 201d of the memory circuit 21b respectively.

Similarly to the above, transistors 134b and 139b of the read buffer circuit 225b are connected to the word lines 183a and 183b respectively. A pair of AND input terminals 209b and 210b of another AND-NOR composite circuit 16b are connected with the terminal 201b of the memory circuit 21a and the gate of the transistor 134b respectively, while another pair of AND input terminals 207b and 208b are connected with the gate of the transistor 139b and the terminal 201d of the memory circuit 21b respectively.

A data write operation of the memory cell circuit 170 is absolutely identical to that of the eighth embodiment. A data read operation is now briefly described.

When at least either the read word line 182a or 183a is converted to a high level, data held in the terminal 201b of the memory circuit 21a is read. The data is outputted to a read bit line 192a when the read word line 182a is converted to a high level, while the same is outputted to a read bit line 192b when the read word line 183a is converted to a high level.

Similarly to the above, either the read word line 182b or 183b is converted to a high level in order to read data held in the terminal 201d of the memory circuit 21b. The data is outputted to the read bit line 192a when the read word line 182b is converted to a high level, while the same is outputted to the read bit line 192b when the read word line 183b is converted to a high level.

A detailed read operation is similar to that of the eighth embodiment, whereby an effect similar to that of the eighth embodiment can be attained in the tenth embodiment.

C. Description of Occupied Area

The effects attained by the first to tenth embodiments are as described in the above description. These embodiments are mostly applied to gate arrays. In this case, the effects in operation are attained without much increasing occupied areas as compared with the prior art. This is now described with reference to the drawings.

Figure 20:
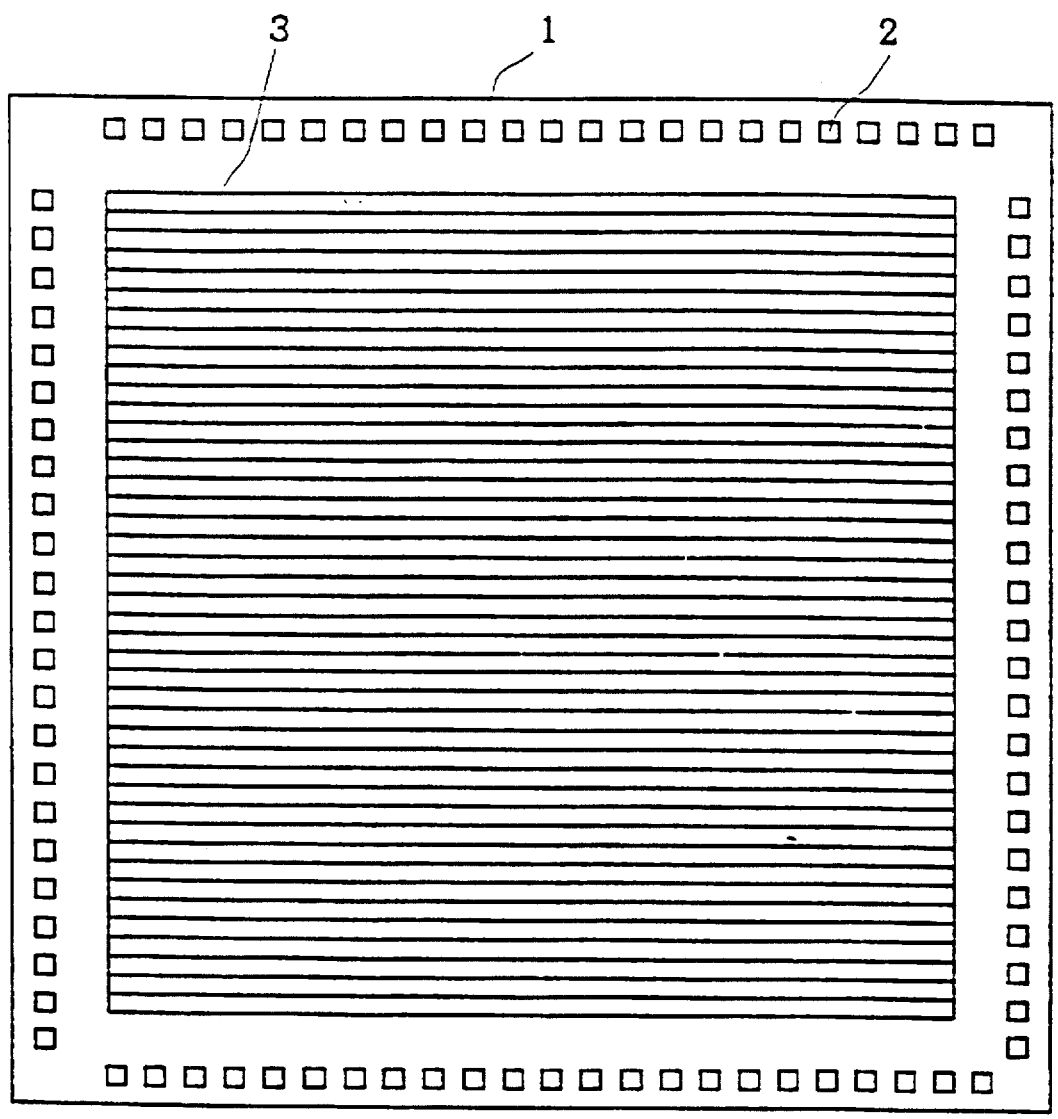
FIG. 20 is a plan view for illustrating an effect of the present invention.

FIG. 20 is a plan view showing a semiconductor integrated circuit device (chip) 1 forming a CMOS gate array. A number of input/output pads 2 are arranged in the peripheral edge portions of the chip 1, while a plurality of basic cell stages 3 are provided in the center thereof.

Figure 21:
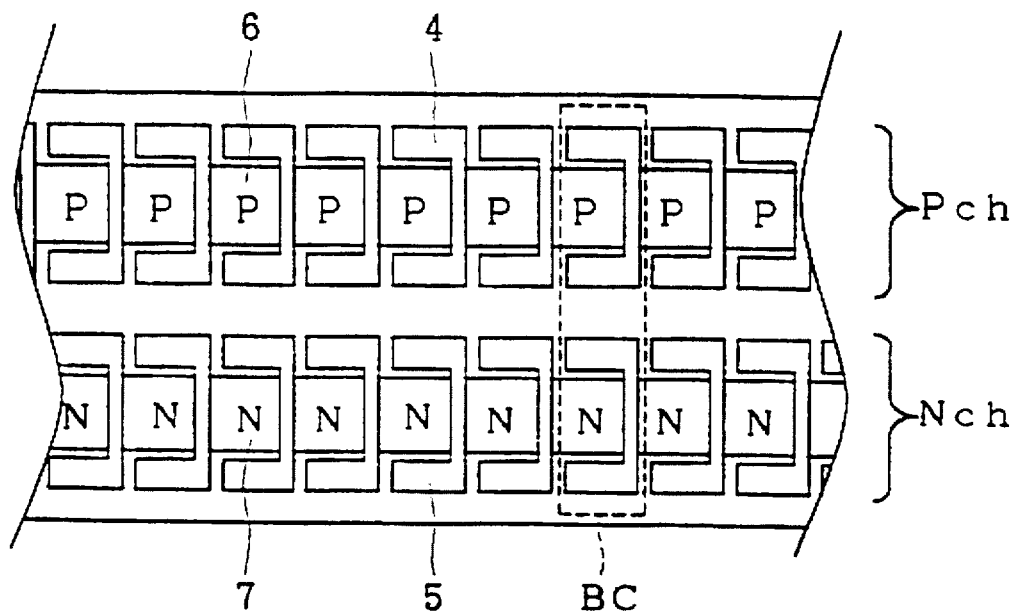
FIG. 21 is an enlarged view showing a basic cell stage 3.

FIG. 21 is a plan view showing one of the basic cell stages 3 in an enlarged manner. This figure illustrates a single basic cell stage 3 in a gate array employing a gate isolation system. The single basic cell stage 3 is formed by a plurality of gates 4 and a plurality of P-type diffusion regions 6 which are arranged in a single column, and a plurality of gates 5 and a plurality of N-type diffusion regions 7 which are arranged in another column.

Figure 22:
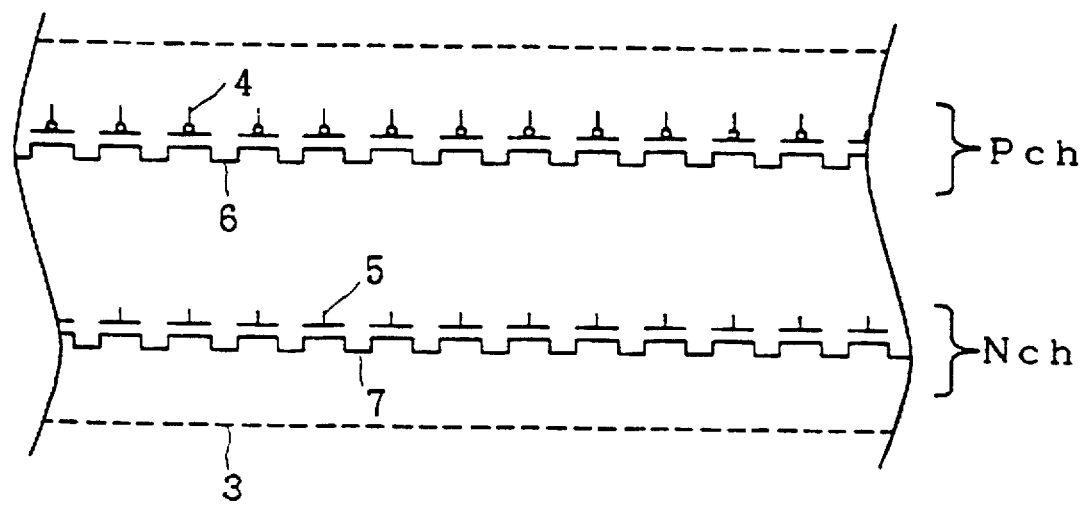
FIG. 22 is a circuit diagram showing the basic cell stage 3.

FIG. 22 is a circuit diagram showing the basic cell stage 3 of FIG. 21. A single gate 4 and P-type diffusion regions 6 provided on both sides thereof define a single P-channel MOS transistor. On the other hand, a single gate 5 and N-type diffusion regions 7 provided on both sides thereof define a single N-channel MOS transistor. In the gate isolation system, a potential which is supplied to a gate of a transistor to be isolated is controlled to bring the same into a cutoff state, thereby dividing a column of serially connected transistors and forming a desired circuit.

Referring again to FIG. 21, each basic cell BC is formed by a single N-channel MOS transistor and a single P-channel MOS transistor. A desired circuit is formed in units of such basic cells BC.

Figure 23:
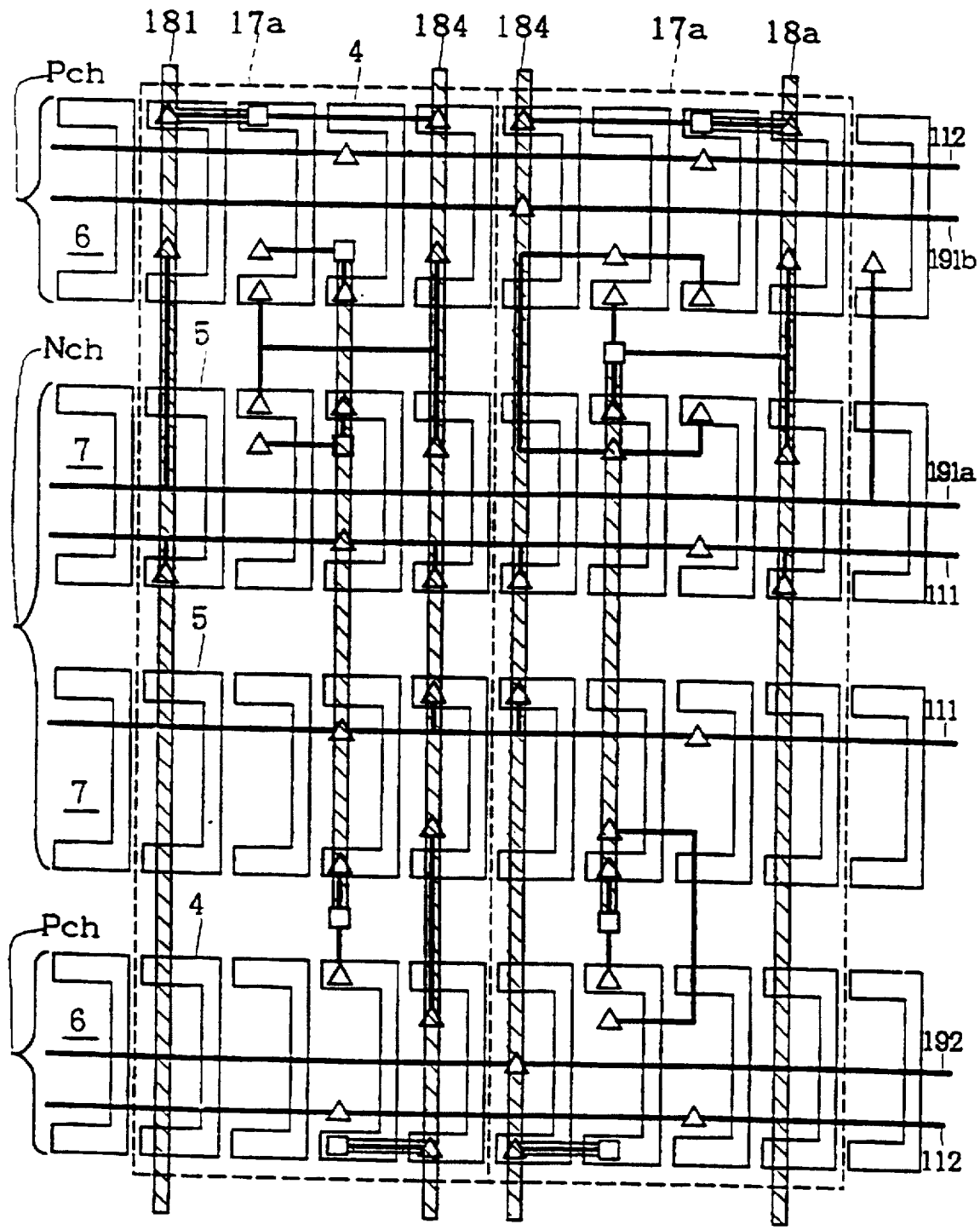
FIG. 23 is a wiring diagram showing the prior art.
Figure 32:
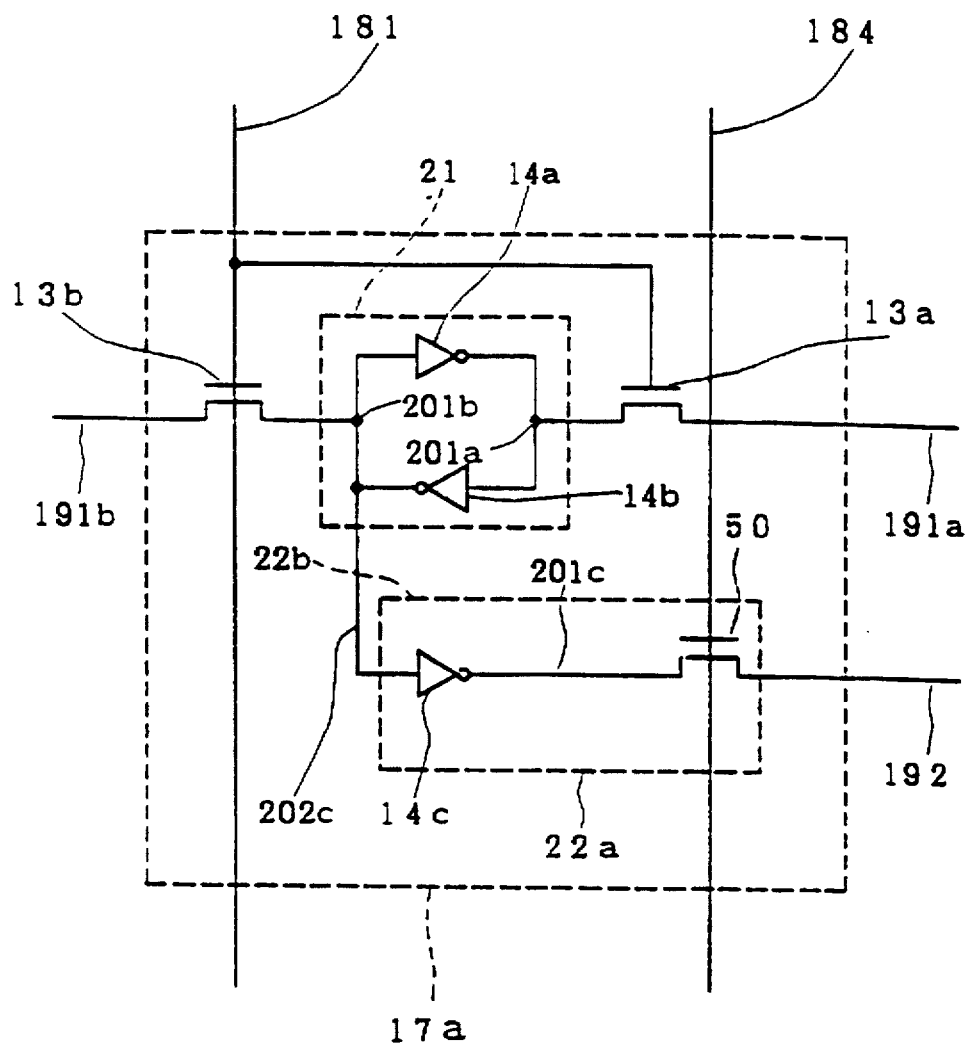
FIG. 32 is a circuit diagram showing the prior art.
Figure 33:
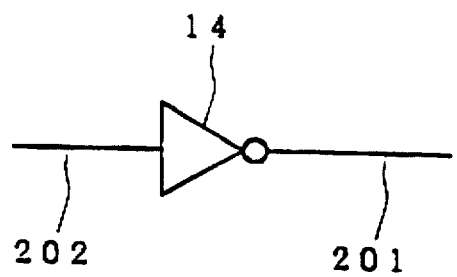
FIG. 33 is a logic symbol diagram of an inverter circuit.
Figure 34:
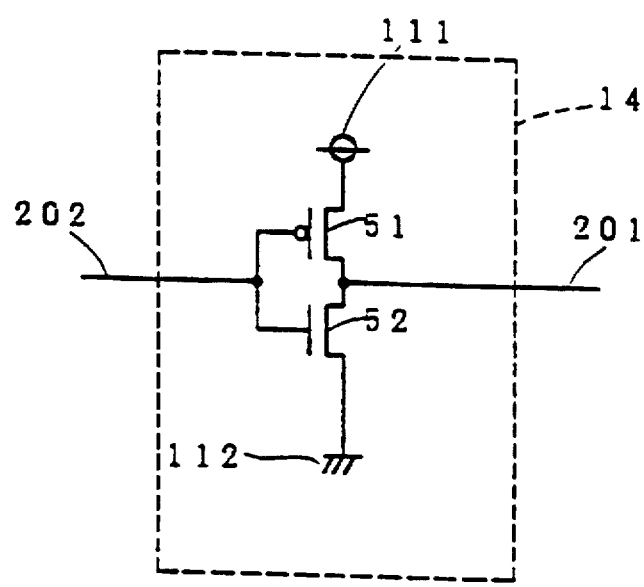
FIG. 34 is a circuit diagram showing an exemplary structure of an inverter circuit.
Figure 35:
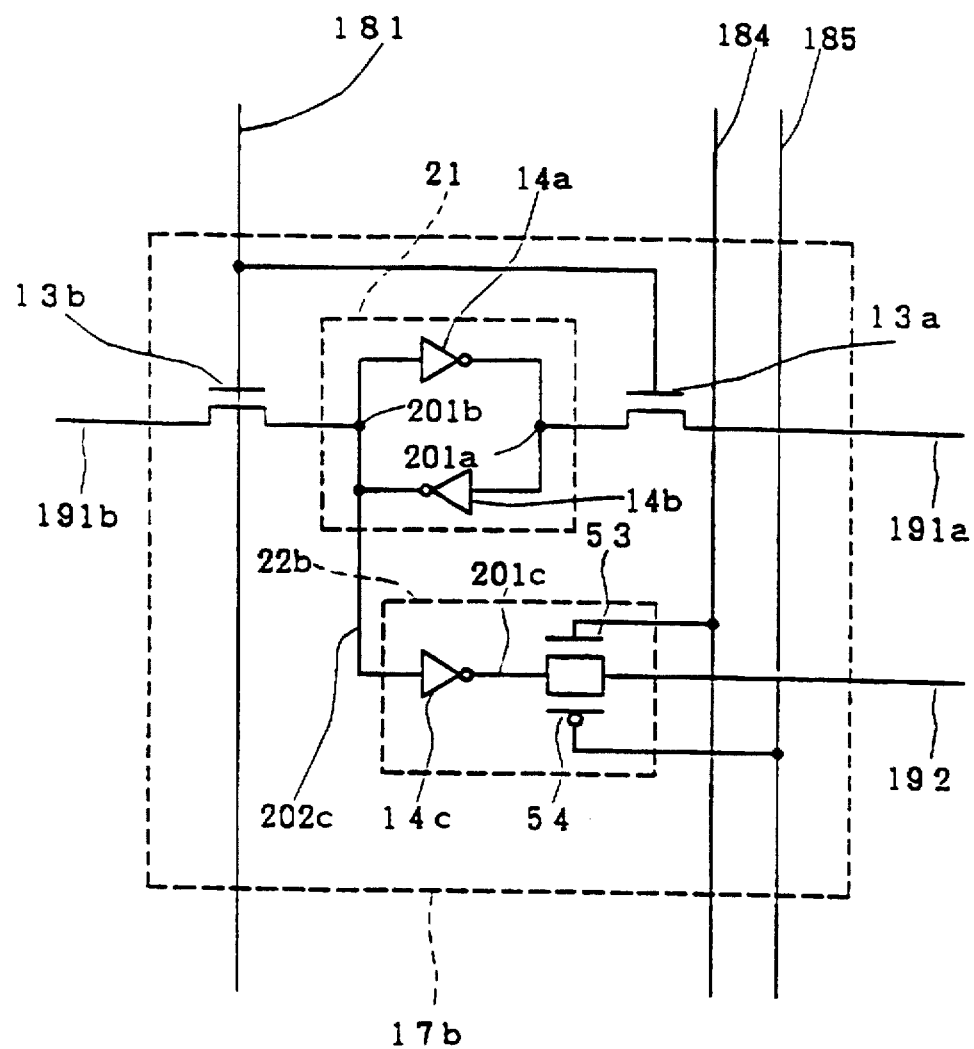
FIG. 35 is a circuit diagram showing the prior art.
Figure 36:
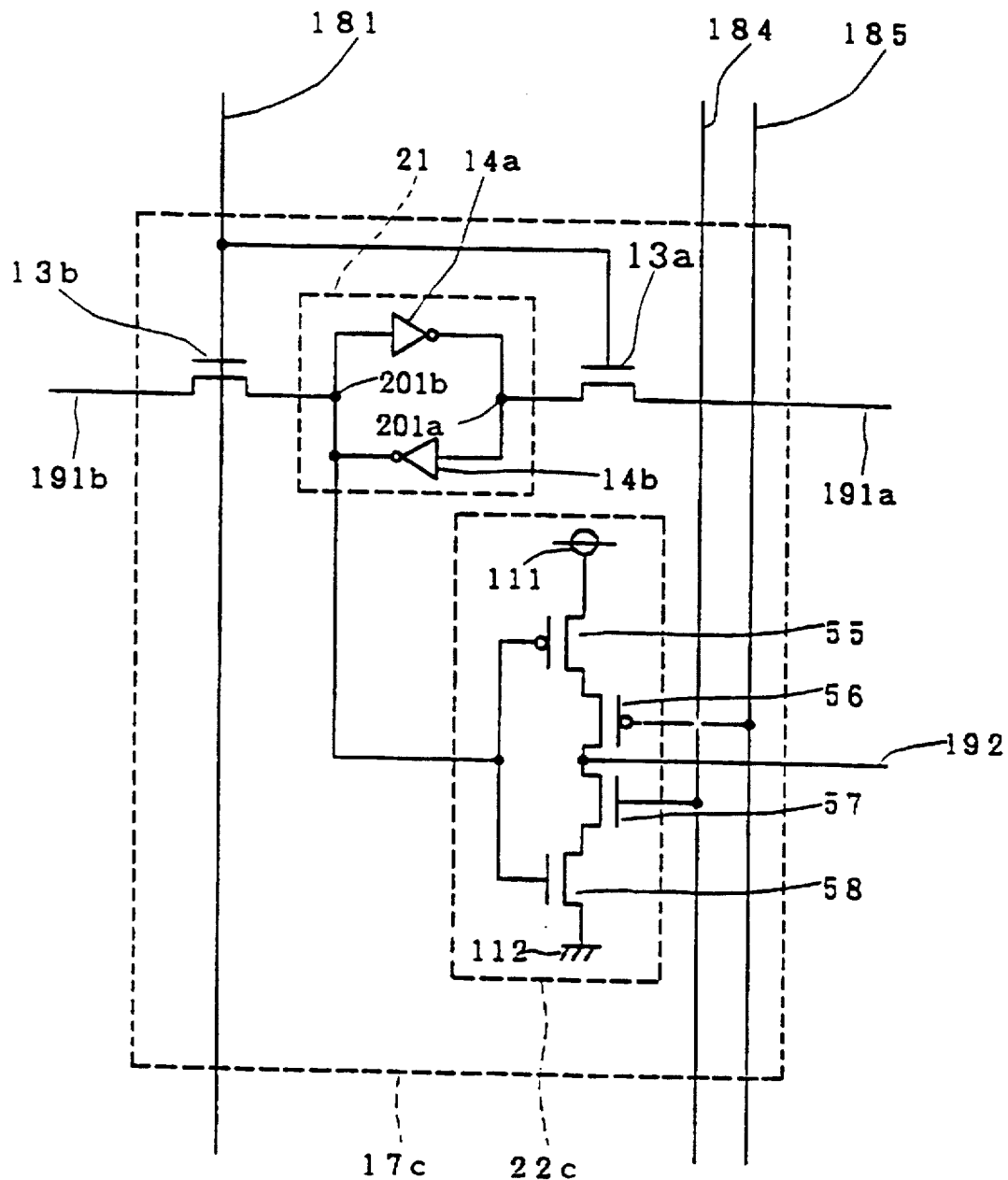
FIG. 36 is a circuit diagram showing another prior art.

For example, FIG. 23 is a wiring diagram showing two memory cell circuits 17a, according to the prior art shown in FIG. 32, which are formed by gate arrays. Referring to FIG. 23, thick solid lines show first layer wiring and hatched lines show second layer wiring respectively. Triangles show contact holes connecting gates 4 and 5, P-type diffusion regions 6 and N-type diffusion regions 7 with the first layer wires, while quadrangles show through holes connecting the first layer wires with the second layer wires. FIGS. 24 to 28 are illustrated in similar manners to the above.

Two memory circuits 17a, each including a single memory circuit 21 (not shown to avoid complicatedness, throughout FIGS. 23 to 28), are formed by 16 basic cells BC. In other words, eight basic cells BC are required for each memory circuit 21.

Figure 24:
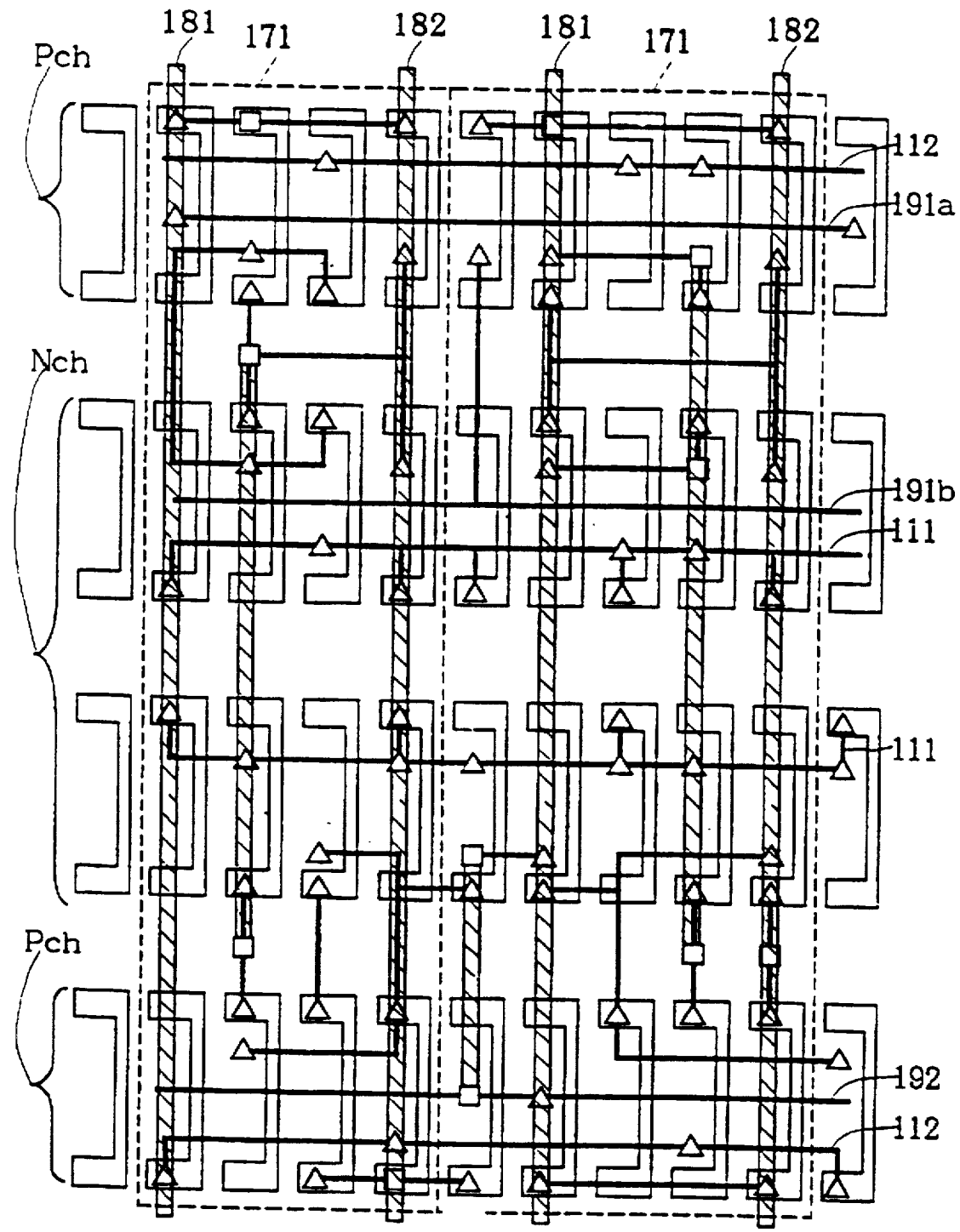
FIG. 24 is a wiring diagram showing the first embodiment of the present invention.

FIG. 24 is a wiring diagram showing two memory cell circuits 171 according to the first embodiment. The two memory cell circuits 171, each including a single memory circuit 21, are formed by 18 basic cells BC. In other words, nine basic cells BC are required for each memory circuit 21.

Thus, it is understood that an occupied area of the first embodiment of the present invention which is implemented in a gate array is only 9/8 times that of the prior art.

Figure 25:
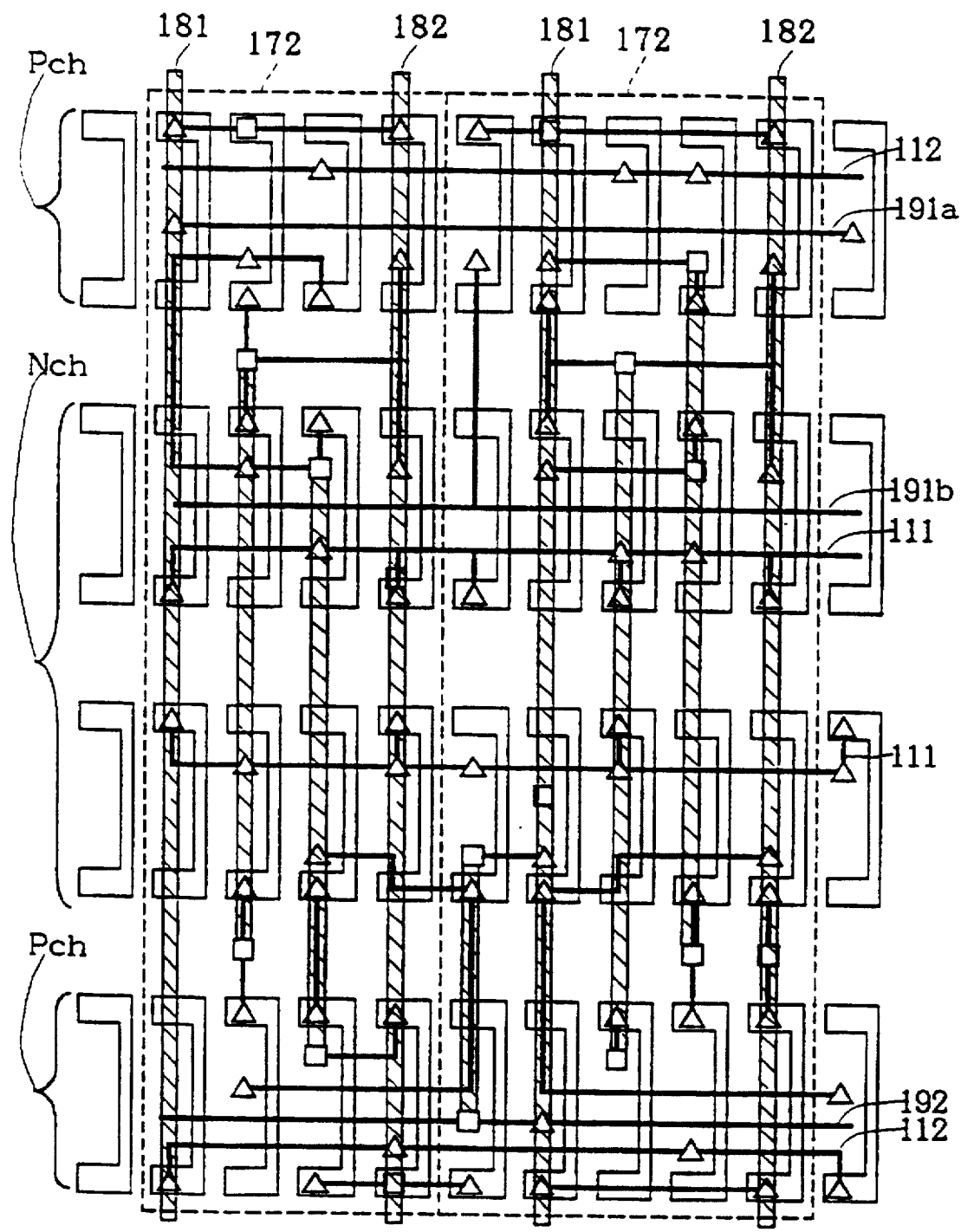
FIG. 25 is a wiring diagram showing the second embodiment of the present invention.

FIG. 25 is a wiring diagram showing two memory cell circuits 172 according to the second embodiment. The two memory cell circuits 172, each including a single memory circuit 21, are formed by 18 basic cells BC. Thus, it is understood that an occupied area of the second embodiment of the present invention which is implemented in a gate array is only 9/8 times that of the prior art, similarly to the first embodiment.

Figure 26:
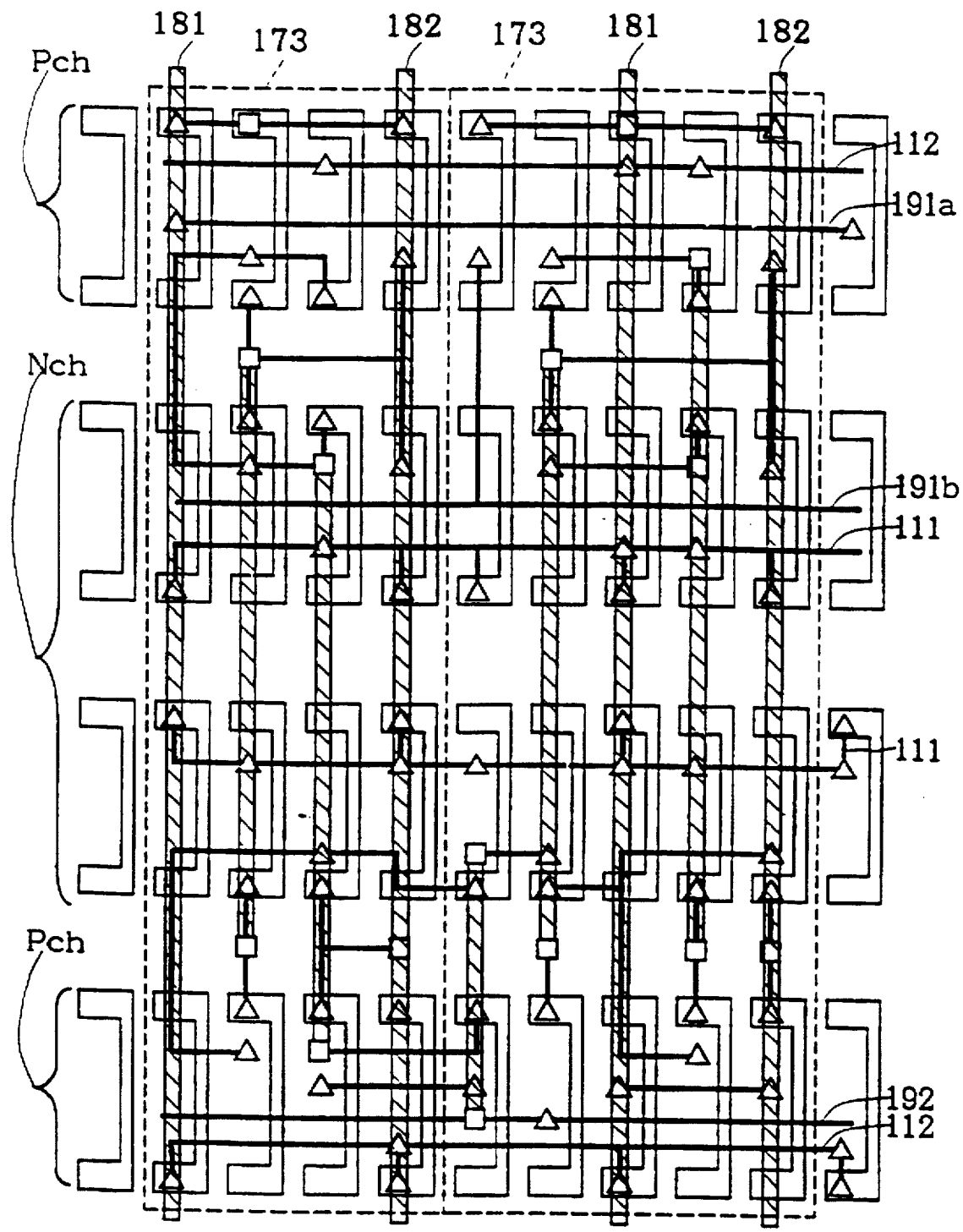
FIG. 26 is a wiring diagram showing the third embodiment of the present invention.

FIG. 26 is a wiring diagram showing two memory cell circuits 173 according to the third embodiment. The two memory cell circuits 173, each including a single memory circuit 21, are formed by 18 basic cells BC. Thus, it is understood that an occupied area of the third embodiment of the present invention which is implemented in a gate array is only 9/8 times that of the prior art, similarly to the first and second embodiments.

Figure 27:
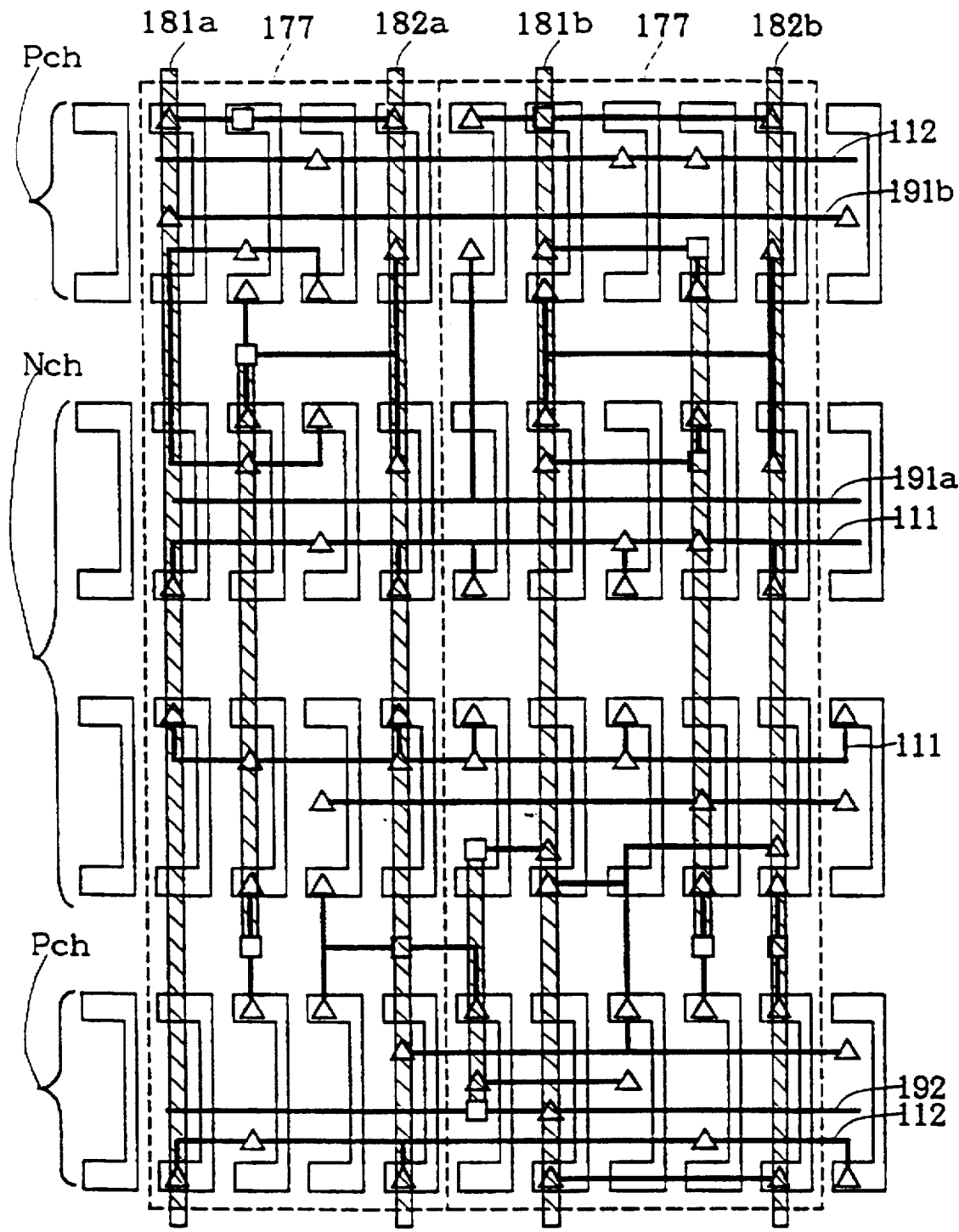
FIG. 27 is a wiring diagram showing the seventh embodiment of the present invention.

FIG. 27 is a wiring diagram showing a memory cell circuit 177 according to the seventh embodiment. The memory cell circuit 177, including two memory means, i.e., memory circuits 21a and 21b, is formed by 18 basic cells BC. In other words, nine basic cells BC are required for single memory means, similarly to the first to third embodiments.

Thus, it is understood that an occupied area of the seventh embodiment of the present invention which is implemented in a gate array is only 9/8 times that of the prior art, similarly to the first to third embodiments.

Figure 28:
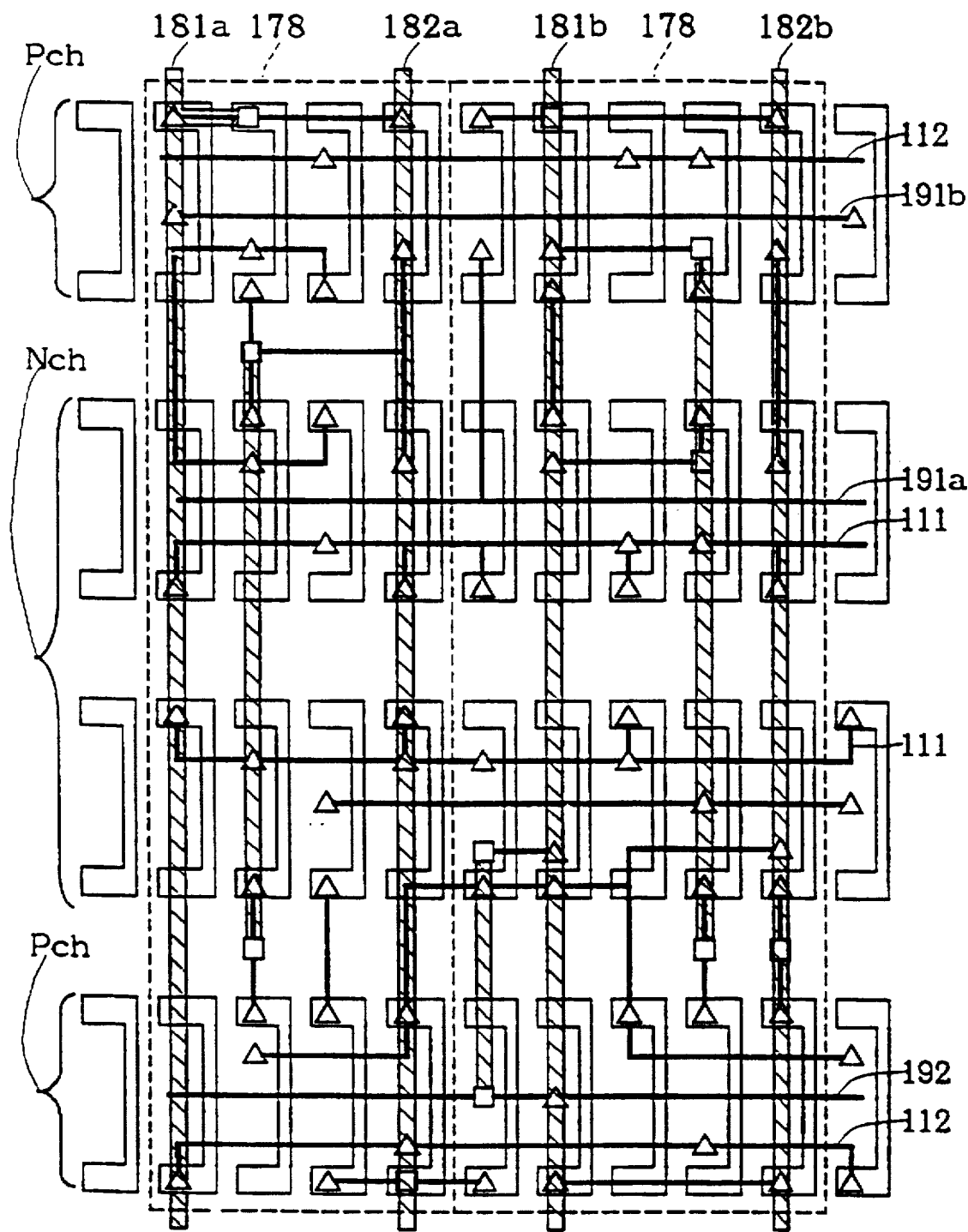
FIG. 28 is a wiring diagram showing the eighth embodiment of the present invention.

FIG. 28 is a wiring diagram showing a memory cell circuit 178 according to the eighth embodiment. The memory cell circuit 178, including two memory means, i.e., memory circuits 21a and 21b, is formed by 18 basic cells BC. In other words, nine basic cells BC are required for single memory means, similarly to the seventh embodiment.

Thus, it is understood that an occupied area of the eighth embodiment of the present invention which is implemented in a gate array is only 9/8 times that of the prior art, similarly to the seventh embodiment.

Thus, the effects in operation of the first to third embodiments and the seventh and eighth embodiments can be attained without much increasing the occupied areas as compared with the prior art.

D. Description of Embodiments for Improving Transistors of Two Conductivity Types Description in the item B has been made on embodiments to which the present invention is applied noting only either P-channel or N-channel MOS transistors. Description is now made on embodiments noting both of P-channel and N-channel transistors for improving operational speeds, to whichever logical levels read bit lines are driven.

(D-1) Eleventh Embodiment

Figure 29:
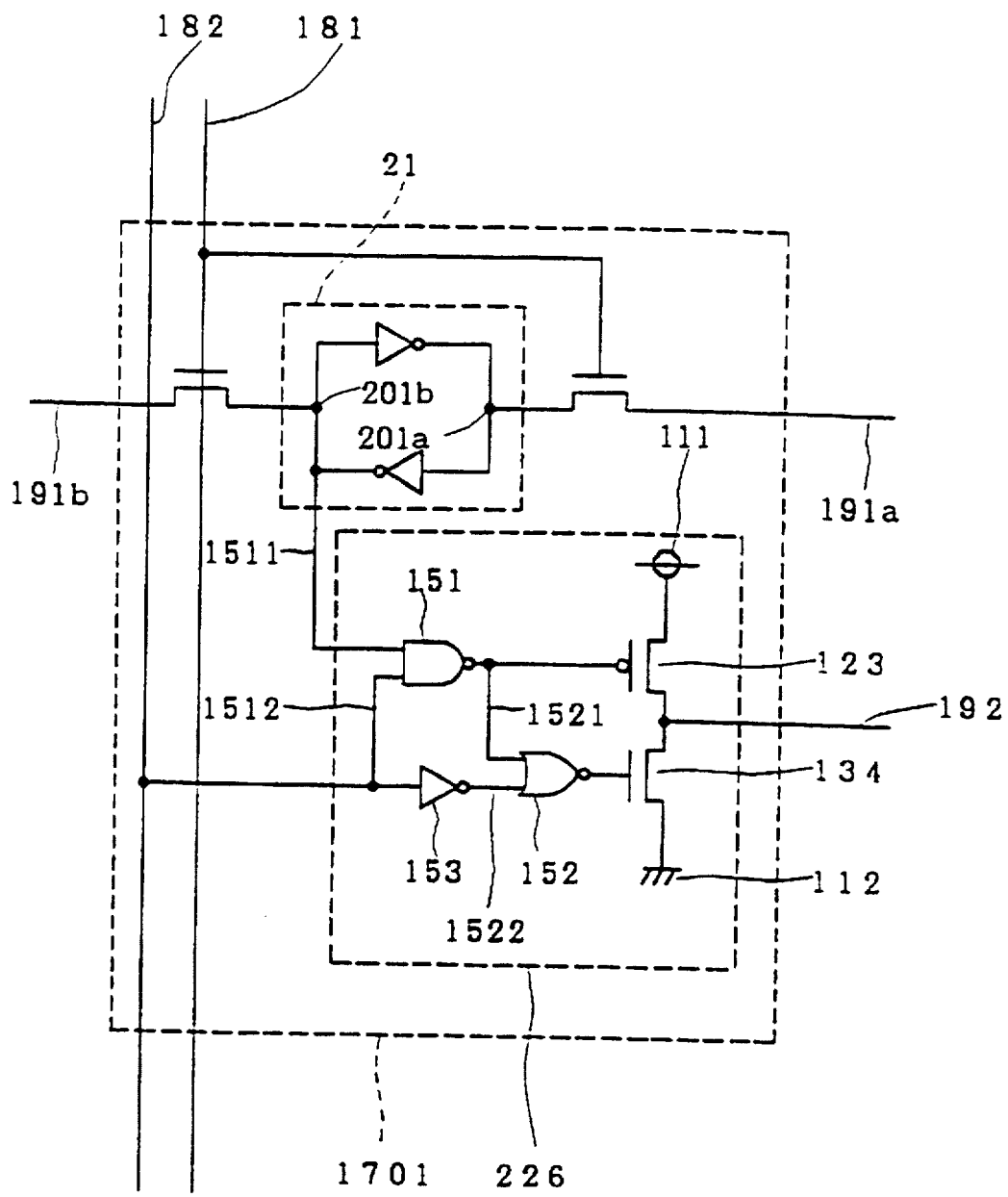
FIG. 29 is a circuit diagram showing the structure of an eleventh embodiment according to the present invention.

FIG. 29 is a circuit diagram showing a memory cell circuit 1701 according to an eleventh embodiment of the present invention. In this embodiment, a read buffer circuit 226 is provided in place of the read buffer circuit 221 in the structure shown in the first embodiment.

In the read buffer circuit 226, a P-channel MOS transistor 123 and an N-channel MOS transistor 134 are connected in series across a power supply line 111 and a grounding conductor 112. The transistor 123 receives an output of a NAND gate 151 in its gate, while the transistor 134 receives an output of a NOR gate 152 in its gate respectively.

The NAND gate 151 has an input terminal 1511 which is connected with a terminal 201b of a memory circuit 21 and another input terminal 1512 which is connected with an input terminal of an inverter circuit 153 respectively. The NOR gate 152 has an input terminal 1521 which is supplied with an output of the NAND gate 151 and another input terminal 1522 which is supplied with an output of the inverter circuit 153 respectively. An input terminal of the inverter circuit 153 is connected with a read word line 182.

In the memory cell circuit 1701, the memory circuit 21 is formed similarly to that of the first embodiment, whereby its read operation is similar to that of the first embodiment. A read operation of this embodiment is now described on the basis of Table 1.

TABLE 1

| Logic of Word Line 182 | Logic of Terminal 210b | Output of Gate 151 | Output of Gate 152 | State of TRAN 123 | State of TRAN 134 | Logic of Bit Line 192 |
|---|---|---|---|---|---|---|
| L | L | H | L | Cut off | Cut off | Z |
| L | H | H | L | Cut off | Cut off | Z |
| H | L | H | H | Cut off | Conduct | L |
| H | H | L | L | Conduct | Cut off | H |

When the read word line 182 is at a low logical level, output logical levels of the gates 151 and 152 go high and low respectively without depending on a logical level which is supplied to the terminal 201b of the memory circuit 21. In this case, therefore, both of the transistors 123 and 134 enter cutoff states and the bit line 192 enters a disconnected state, i.e., a floating state. This is expressed as a "Z" level in Table 1.

When the read word line 182 is at a high logical level, on the other hand, both outputs of the gates 151 and 152 go to logical levels which are complementary to that supplied to the terminal 201b of the memory circuit 21.

When the terminal 201b of the memory circuit 21 is supplied with a low logical level, therefore, the transistors 123 and 134 enter cutoff and conducting states respectively, whereby the bit line 192 is supplied with a low logical level. When the terminal 201b of the memory circuit 21 is supplied with a high logical level, the bit line 192 is supplied with a high logical level. Namely, a logical level which is identical to that supplied to the terminal 201b of the memory circuit 21 is read out from the bit line 192.

When a high level is outputted in the bit line 192, only the transistor 123 connects the bit line 192 with the power supply line 111. When a low level is outputted in the bit line 192, on the other hand, only the transistor 134 connects the bit line 192 with the grounding conductor 112. Namely, the bit line 192 is driven by a single transistor whichever logical level is outputted, whereby the operating speed is improved as compared with the prior art.

(D-2) Twelfth Embodiment

Figure 30:
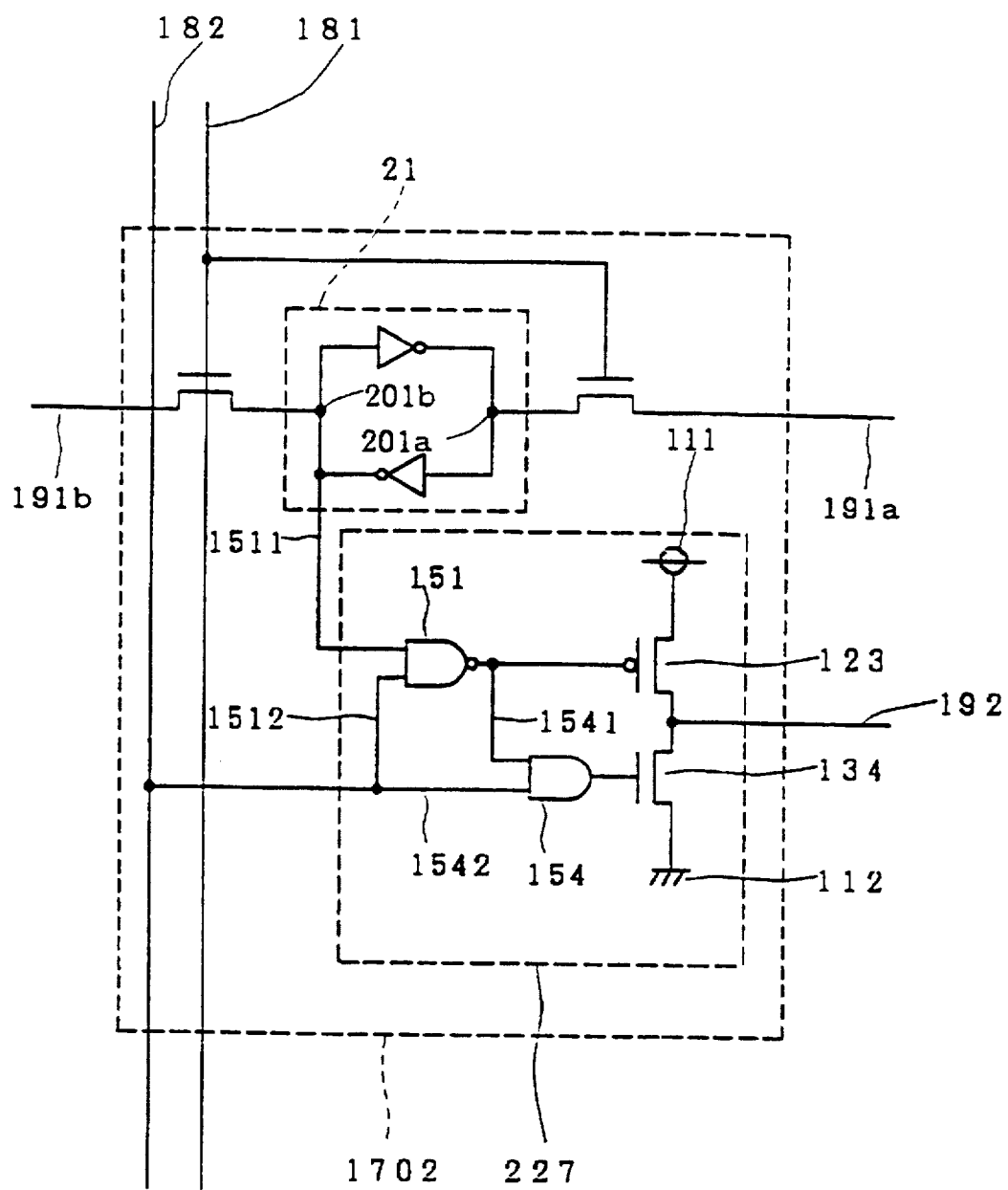
FIG. 30 is a circuit diagram showing the structure of a twelfth embodiment according to the present invention.

FIG. 30 is a circuit diagram showing a memory cell circuit 1702 according to a twelfth embodiment of the present invention. A read buffer circuit 227 is provided in place of the read buffer circuit 226 in the structure shown in the eleventh embodiment.

The read buffer circuit 227 has such a structure that the NOR gate 152 and the inverter circuit 153 in the read buffer circuit 226 are replaced by an AND gate 154. Namely, transistors 123 and 134 are supplied with outputs of a NAND gate 151 and the AND gate 154 in gates thereof respectively.

Further, the NAND gate 151 has an input terminal 1511 which is connected with a terminal 201b of a memory circuit 21 and another input terminal 1512 which is connected with an input terminal 1542 of the AND gate 154 respectively. The input terminal 1542 of the AND gate 154 is connected with a read word line 182. Another input terminal 1541 of the AND gate 154 is supplied with an output of the NAND gate 151.

In the memory cell circuit 1702, the memory circuit 21 is formed similarly to that of the first embodiment, whereby its write operation is similar to that of the first embodiment. On the other hand, a read operation of this embodiment is similar to that of the eleventh embodiment, as shown in Table 2.

TABLE 2

| Logic of Word Line 182 | Logic of Terminal 210b | Output of Gate 151 | Output of Gate 152 | State of TRAN 123 | State of TRAN 134 | Logic of Bit Line 192 |
|---|---|---|---|---|---|---|
| L | L | H | L | Cut off | Cut off | Z |
| L | H | H | L | Cut off | Cut off | Z |
| H | L | H | H | Cut off | Conduct | L |
| H | H | L | L | Conduct | Cut off | H |

The output of the gate 154 in the twelfth embodiment is absolutely similar to that of the gate 152 in the eleventh embodiment. In the twelfth embodiment of the present invention, therefore, it is possible to attain an effect identical to that of the eleventh embodiment.

(D-3) Thirteenth Embodiment

Figure 31:
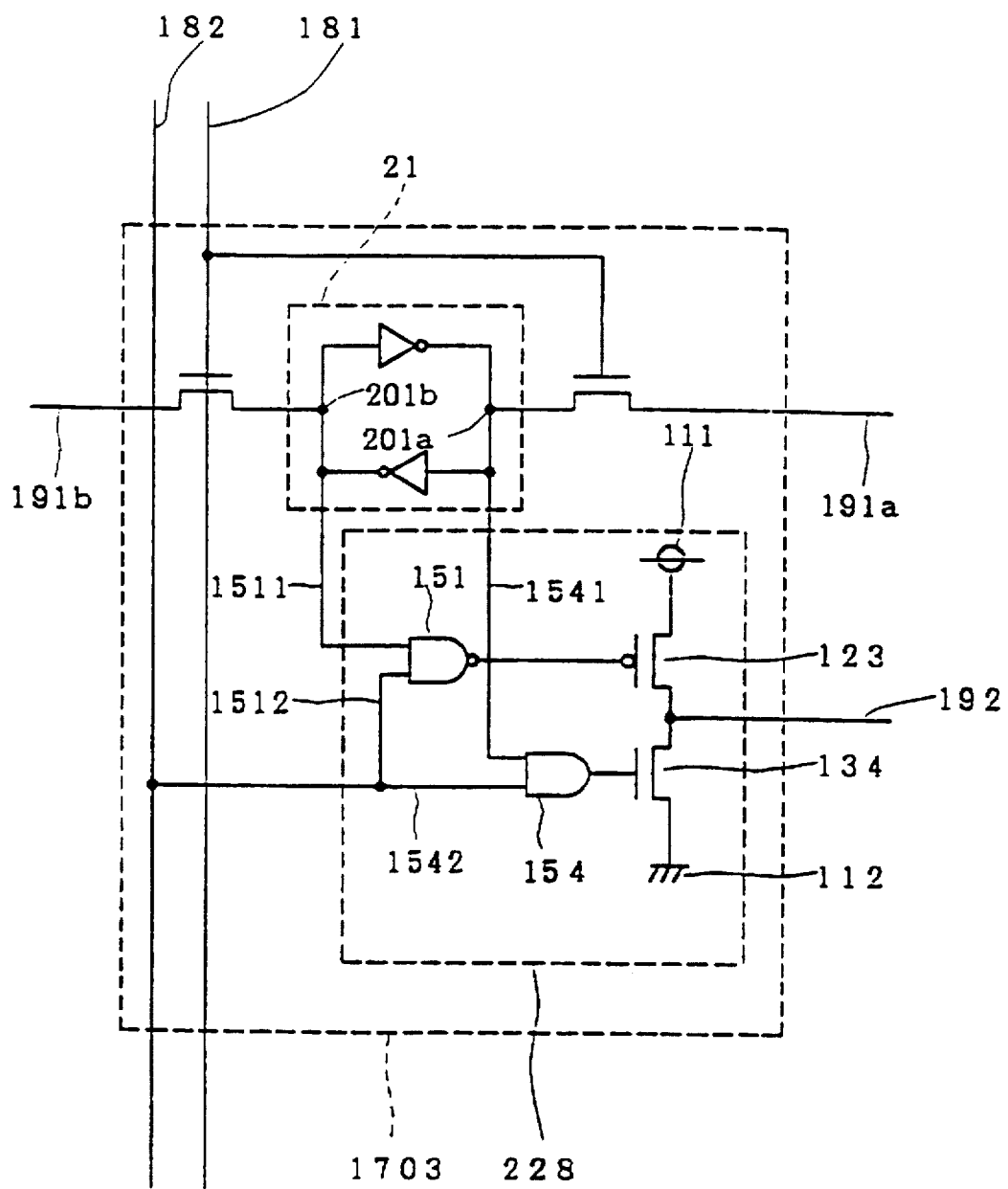
FIG. 31 is a circuit diagram showing the structure of a thirteenth embodiment of the present invention.

FIG. 31 is a circuit diagram showing a memory cell circuit 1703 according to a thirteenth embodiment of the present invention. A read buffer circuit 228 is provided in place of the read buffer circuit 226 in the structure shown in the eleventh embodiment.

In this read buffer circuit 228, an input terminal 1541 of an AND gate 154 is supplied not with an output of a NAND gate 151, but with a logical level which is supplied to a terminal 201a of a memory circuit 21.

In other words, the relation of the thirteenth embodiment to the twelfth embodiment is equivalent to that of the second embodiment to the first embodiment.

In the memory cell circuit 1703, the memory circuit 21 is formed similarly to that of the first embodiment, whereby its write operation is similar to that of the first embodiment. Considering that terminals 201a and 201b of the memory circuit 21 are supplied with complementary logical levels respectively, its read operation is similar to that of the twelfth embodiment, as shown in Table 3.

TABLE 3

| Logic of Word Line 182 | Logic of TRML 201b | Logic of TRML 201a | Output of Gate 151 | Output of Gate 154 | State of TRAN 123 | State of TRAN 134 | Logic of Bit Line 192 |
|---|---|---|---|---|---|---|---|
| L | L | H | H | L | Cut off | Cut off | Z |
| L | H | L | H | L | Cut off | Cut off | Z |
| H | L | H | H | H | Cut off | Conduct | L |
| H | H | L | L | L | Conduct | Cut off | H |

In the thirteenth embodiment of the present invention, therefore, it is possible to attain an effect identical to that of the twelfth embodiment, i.e., similar to that of the eleventh embodiment.

E. Other Modifications

While memory cell circuits of two-port structures are expanded to those of three-port structures in the fourth to sixth and ninth and tenth embodiments, the port numbers can be further expanded through similar methods. Also in this case, it is possible to simultaneously carry out read and write operations since all ports are independent of each other.

While each of the aforementioned embodiments has a single write port, it is possible to simultaneously carry out read and write operations also when two or more write ports are provided, since all ports are independent of each other.

The write access gate may not be formed by an N-channel MOS transistor, but may be formed by a P-channel MOS transistor, by two-channel MOS transistor, or written with a single write bit line.

While the invention has been shown and described in detail, the foregoing description is in all aspects illustrative and not restrictive. It is therefore understood that numerous modifications and variations can be devised without departing from the scope of the invention.

What is claimed is:

1. A memory cell circuit comprising:

memory means for storing memory logic taking either one of first and second logical values being complementary to each other, said memory means having a normal output end for outputting said memory logic; and read means coupled to said memory means, said read means including:

an output terminal, a first potential corresponding to said first logical value, a second potential corresponding to said second logical value, a control terminal supplying a control signal taking said first logical value for supplying said output terminal with output logic being identical to said memory logic while taking said second logical value for bringing said output terminal into a floating state, a first MOS transistor having first and second current electrodes being connected to said first potential and said output terminal respectively, and a control electrode, a second MOS transistor having first and second current electrodes being connected to said second potential and said output terminal respectively, and a control electrode, and a logic circuit coupled to said memory means and said control terminal, for supplying first and second cutoff signals for bringing at least one of said first and second MOS transistors into a cutoff state to said control electrodes of said first and second MOS transistors respectively on the basis of said control signal and said memory logic, wherein said first MOS transistor is of a first conductivity type, and said second MOS transistor is of a second conductivity type being complementary to said first conductivity type, and wherein said first and second cutoff signals are complementary to each other when said control signal performs control of supplying said output terminal with output logic being the same logic as said memory logic, and both said first and second cutoff signals are signals being complementary to said memory logic when said control signal performs control of bringing said output terminal into said floating state, and wherein said logic circuit comprises a first logic element receiving said control signal and said memory logic and inverting the logical sum thereof for producing said first cutoff signal, wherein said memory means has a reverse output end for outputting a logical value being complementary to said memory logic, said logic circuit further comprising a second logic element having a first input being supplied with said control signal and a second input being connected to said reverse output end of said memory means for producing said second cutoff signal by the logical sum of logical values being supplied to said first and second inputs thereof.

2. A memory cell circuit in accordance with claim 1, further comprising write means including a third MOS transistor having a first current electrode being connected to said normal output end, a second current electrode being supplied with a predetermined logical value to be written as said memory logic, and a control electrode being supplied with a write signal for determining whether or not said writing is performed.

* * * * *

UNITED STATES PATENT AND TRADEMARK OFFICE
CERTIFICATE OF CORRECTION

PATENT NO. : 5,793,681
DATED : August 11, 1998
INVENTOR(S) : Koji NII

It is certified that error appears in the above-identified patent and that said Letters Patent is hereby corrected as shown below:

In column 32, line 47, change "sum" to --product--.

In column 32, line 56, change "sum" to --product--.

Signed and Sealed this

Twenty-ninth Day of December, 1998

Attest:

BRUCE LEHMAN

Attesting Officer

Commissioner of Patents and Trademarks